US012574016B2

(12) United States Patent
Liu

(10) Patent No.: US 12,574,016 B2
(45) Date of Patent: Mar. 10, 2026

(54) BULK ACOUSTIC WAVE RESONANCE DEVICE AND BULK ACOUSTIC WAVE FILTER

(71) Applicant: CHANGZHOU CHEMSEMI CO., LTD., Changzhou (CN)

(72) Inventor: Yuhao Liu, Shanghai (CN)

(73) Assignee: CHANGZHOU CHEMSEMI CO., LTD., Changzhou (CN)

( * ) Notice: Subject to any disclaimer, the term of this patent is extended or adjusted under 35 U.S.C. 154(b) by 537 days.

(21) Appl. No.: 17/640,352

(22) PCT Filed: Sep. 5, 2019

(86) PCT No.: PCT/CN2019/104601
§ 371 (c)(1),
(2) Date: Mar. 4, 2022

(87) PCT Pub. No.: WO2021/042344
PCT Pub. Date: Mar. 11, 2021

(65) Prior Publication Data
US 2022/0416765 A1      Dec. 29, 2022

(51) Int. Cl.
*H03H 19/00*      (2006.01)
*H03F 3/24*      (2006.01)
(Continued)

(52) U.S. Cl.
CPC ........... *H03H 19/002* (2013.01); *H03F 3/245* (2013.01); *H03H 9/02007* (2013.01);
(Continued)

(58) Field of Classification Search
CPC ......... H03H 9/02007; H03H 9/13; H03H 9/54
See application file for complete search history.

(56) References Cited

U.S. PATENT DOCUMENTS

| 5,852,337 A | 12/1998 | Takeuchi et al. |
| 2007/0228880 A1 | 10/2007 | Higuchi et al. |

(Continued)

FOREIGN PATENT DOCUMENTS

| CN | 1170990 A | 1/1998 |
| CN | 105897211 A | 8/2016 |

(Continued)

OTHER PUBLICATIONS

European Patent Office, Extended European Search Report Issued in Application No. 19944526.3, Sep. 22, 2023, Germany, 21 pages.

(Continued)

*Primary Examiner* — Samuel S Outten
(74) *Attorney, Agent, or Firm* — Kilpatrick Townsend & Stockton LLP

(57) ABSTRACT

The present disclosure provides a bulk acoustic wave resonance device, a bulk acoustic wave filter device and a radio frequency front end device. The bulk acoustic wave resonance device includes a first layer including a cavity disposed at a first side of the first layer; a first electrode layer disposed in the cavity; a second layer disposed at the first side and disposed on the first electrode layer, and the second layer is a flat layer and covers the first cavity; and a second electrode layer disposed at the first side and disposed on the second layer, and the first electrode layer includes at least two first electrode bars or the second electrode layer includes at least two second electrode bars. The present disclosure can increase the difference between acoustic impedance of a resonance region and a non-resonance region, thereby increasing Q value of the resonance device.

50 Claims, 13 Drawing Sheets

(51) Int. Cl.
    *H03H 9/02*         (2006.01)
    *H03H 9/13*         (2006.01)
    *H03H 9/54*         (2006.01)

(52) U.S. Cl.
    CPC ................ *H03H 9/13* (2013.01); *H03H 9/54* (2013.01); *H03F 2200/294* (2013.01); *H03F 2200/451* (2013.01)

(56) References Cited

U.S. PATENT DOCUMENTS

| | | | | |
|---|---|---|---|---|
| 2007/0267942 | A1* | 11/2007 | Matsumoto | H03H 9/178 310/366 |
| 2009/0295506 | A1 | 12/2009 | Handtmann et al. | |
| 2010/0039000 | A1 | 2/2010 | Milson et al. | |
| 2010/0123367 | A1* | 5/2010 | Tai | H03H 9/02228 310/313 B |
| 2011/0132866 | A1 | 6/2011 | Pijolat | |
| 2012/0086523 | A1 | 4/2012 | Meltaus | |
| 2012/0096697 | A1* | 4/2012 | Grannen | H10N 30/074 29/25.35 |
| 2014/0130319 | A1* | 5/2014 | Iwamoto | H03H 9/059 29/25.35 |
| 2016/0049469 | A1* | 2/2016 | Yoshikawa | C04B 35/453 501/153 |
| 2016/0204760 | A1 | 7/2016 | KOn et al. | |
| 2016/0352304 | A1* | 12/2016 | Kadota | H03H 9/02559 |
| 2017/0149405 | A1 | 5/2017 | Kishimoto | |
| 2018/0183405 | A1 | 6/2018 | Feng et al. | |
| 2018/0309428 | A1 | 10/2018 | Lim et al. | |
| 2019/0007023 | A1 | 1/2019 | Yen | |
| 2019/0260354 | A1* | 8/2019 | Pao | H03H 9/173 |
| 2019/0372547 | A1* | 12/2019 | Kishimoto | H03H 3/02 |

| | | | | |
|---|---|---|---|---|
| 2020/0235716 | A1* | 7/2020 | Eid | H01L 23/66 |
| 2021/0211115 | A1 | 7/2021 | Zuo et al. | |
| 2021/0265233 | A1* | 8/2021 | Nomiya | H03H 9/25 |

FOREIGN PATENT DOCUMENTS

| | | |
|---|---|---|
| CN | 107528561 A | 12/2017 |
| CN | 107733395 A | 2/2018 |
| CN | 108092639 A | 5/2018 |
| CN | 207339805 U | 5/2018 |
| CN | 109309483 A | 2/2019 |
| CN | 110166012 A | 8/2019 |
| WO | 2019095640 A1 | 5/2019 |

OTHER PUBLICATIONS

Hagelauer A et al: "Low-loss BAW filters on high resistivity silicon for mobile radio", IEEE Microwave Symposium Digest, Jun. 7, 2009, total 4 pages.

State Intellectual Property Office of the People's Republic of China, Office Action Issued in Application No. 201980098511.2, Apr. 15, 2024, 25 pages.

Ventsislav Yantchev et al, "Micromachined Thin Film Plate Acoustic Resonators Utilizing the Lowest Order Symmetric Lamb Wave Mode" IEEE Transactions on Ultrasonics, Ferroelectrics, and Frequency Control, vol. 53, No. 1, Jan. 2007, total 9 pages.

Zou Jie et al., "Transducer design for AIN Lamb wave resonators," Journal of Applied Physics, American Institute of Physics, 2 Huntington Quadrangle, Melville, NY 11747, vol. 121, No. 15, Apr. 19, 2017 total 10 pages.

European Patent Office, the partial supplementary European search report issued in Application No. 19944526.3 on May 15, 2023, Germany, 15 pages.

The international search report mailed May 28, 2020 in PCT Application No. PCT/CN2019/104601.

\* cited by examiner

300

309

307

305

301b

301a

303

301

A    A

300

309

307

305

301a

303b

301

B    B (i)                    (ii)                    (iii)

BULK ACOUSTIC WAVE RESONANCE DEVICE AND BULK ACOUSTIC WAVE FILTER

CROSS-REFERENCE TO RELATED APPLICATIONS

This application is the national phase of International Application No. PCT/CN2019/104601, filed on Sep. 5, 2019, the entire disclosures of which are incorporated herein by reference.

FIELD

The present disclosure relates to the field of semiconductors, and in particular to a bulk acoustic wave resonance device, a bulk acoustic wave filter device and a radio frequency front end device.

BACKGROUND

A Radio Frequency (RF) front-end chip of a wireless communication device includes a power amplifier, an antenna switch, a radio frequency filter, a duplexer, a multiplexer and a low noise amplifier, etc., and the radio frequency filter includes a Surface Acoustic Wave (SAW) filter, a Bulk Acoustic Wave (BAW) filter, a Micro-Electro-Mechanical System (MEMS) filter, and an Integrated Passive Device (IPD) filter, etc. As both a SAW resonator and a BAW resonator have a high quality value (Q value), a radio frequency filter including a SAW resonator, namely a SAW filter, and that including a BAW resonator, namely a BAW filter, have low insertion loss and high out-of-band rejection, and thus become current mainstream radio frequency filters used by wireless communication devices such as mobile phones and base stations. The Q value is a quality factor value of a resonator, and is defined by a center frequency divided by 3 dB bandwidth of the resonator. An application frequency of the SAW filter is generally from 0.4 GHz to 2.7 GHz and an application frequency of the BAW filter is generally from 0.7 GHz to 7 GHz.

Compared with a SAW resonator, a BAW resonator has better performance, but the manufacturing cost of the BAW resonator is higher than that of the SAW resonator due to more complicated process. However, as wireless communication technology gradually evolves, more and more frequency bands are used. Moreover, with the application of frequency band superposition technology such as carrier aggregation, mutual interference between wireless frequency bands becomes more and more serious. High performance BAW technology can solve the problem of mutual interference. With the advent of 5G era, wireless mobile networks have adopted higher frequency bands, and currently, only BAW technology can solve the filtering problem at high frequency.

FIG. 1a illustrates a BAW filter circuit including a ladder circuit consisting of BAW resonators, and f1, f2, f3 and f4 represent four different frequencies, respectively. Within each BAW resonator, alternating voltages with different polarities are supplied to metal electrodes on both sides of a piezoelectric layer of the resonator, an acoustic wave is generated by the piezoelectric layer under the alternating voltages with different polarities, and the acoustic wave within the resonator propagates in a direction perpendicular to the piezoelectric layer. In order to form resonance, the acoustic wave requires total reflection on an upper surface of an upper metal electrode and on a lower surface of a lower metal electrode to form a standing acoustic wave. A condition for an acoustic wave reflection is that acoustic impedance of medium in contact with the upper surface of the upper metal electrode and the lower surface of the lower metal electrode is greatly different from that of a metal electrode.

A Film Bulk Acoustic Wave Resonator (FBAR) is a kind of BAW resonator which can restrain acoustic wave energy inside the resonator. There is air or vacuum above a resonance region of the BAW resonator, and there is a cavity below the resonance region of the BAW resonator. Because the acoustic impedance of air is very different from that of metal electrodes, acoustic waves can be totally reflected on an upper surface of an upper metal electrode and a lower surface of a lower metal electrode to form a standing wave.

FIG. 1b illustrates a schematic structural view of a cross-section A of an FBAR 100. The FBAR 100 includes a substrate 101, an electrode layer 105, a piezoelectric layer 107 and an electrode layer 109. The substrate 101 includes a cavity 103 embedded at an upper surface of the substrate 101. The electrode layer 105 is disposed on the substrate 101 and the cavity 103. The piezoelectric layer 107 is disposed on the substrate 101 and covers the electrode layer 105. The piezoelectric layer 107 includes a convex part 107a. The electrode layer 109 is disposed on the piezoelectric layer 107 and includes a convex part 109a, and the convex part 109a is disposed on the convex part 107a. A resonance region 111 (i.e., an overlap region of the electrode layer 105 and the convex part 109a) is disposed above the cavity 103, where the resonance region 111 not only overlaps with but also touches the substrate 101. If the acoustic impedance of the substrate 101 closes to that of the piezoelectric layer 107, the energy of the resonance region 111 spreads to the non-resonance region in a direction indicated by an arrow 113 and propagates into the substrate 101, which may cause a decrease of the Q value of the resonator. In addition, since the electrode layer 105 protrudes above the substrate 101, forming the piezoelectric layer 107 directly on the electrode layer 105 and the substrate 101 may cause some crystal grains in the piezoelectric layer 107, for example, some crystal grains in both side portions 115 of the convex part 107a, to suffer from a significant change to their orientation and to be not parallel to other crystal grains, for example, some crystal grains in a middle portion 117 of the convex part 107a, which may cause a decrease of electromechanical coupling factor and Q value of the FBAR. Furthermore, after the electrode layer 109 is formed, a frequency of the resonator is changed by modifying a thickness of the electrode layer.

SUMMARY

The present disclosure is to provide a bulk acoustic wave resonance device, and a resonance region of the bulk acoustic wave resonance device is suspended relative to a cavity in an intermediate layer or a support layer or a substrate, to increase the difference between the acoustic impedance of the resonance region and that of a non-resonance region, thereby increasing Q value of the resonance device. In addition, a piezoelectric layer of the bulk acoustic wave resonance device does not include crystal grains which suffer from a significant change to their orientation, thereby increasing an electromechanical coupling factor of the resonance device and the Q value of the resonance device. Furthermore, when forming an electrode layer, a frequency of the resonance device can be changed by modifying a width of electrode bars or an interval between two adjacent electrode bars.

To this end, embodiments of the present disclosure provide a bulk acoustic wave resonance device, including: a first layer including a cavity disposed at a first side of the first layer; a first electrode layer disposed in the cavity; a second layer disposed at the first side and disposed on the first electrode layer, wherein the second layer is a flat layer and covers the cavity; and a second electrode layer disposed at the first side and disposed on the second layer, and the first electrode layer includes at least two first electrode bars or the second electrode layer includes at least two second electrode bars.

It should be noted that by adjusting positions of the first electrode layer and the second electrode layer and a resonance region, that is an overlap region by the first electrode and the second electrode, neither overlaps with nor is in contact with the first layer, and the resonance region is suspended relative to the cavity, difference between the acoustic impedance of the resonance region and that of a non-resonance region can be increased, thereby increasing the Q value of the resonance device. Furthermore, when forming the electrode layer, the frequency of the resonance device can be changed by modifying a width of the at least two first electrode bars or the at least two second electrode bars or an interval between two adjacent first electrode bars or two adjacent second electrode bars.

In some embodiments, the first electrode layer includes a first polarity and the second electrode layer includes a second polarity. In some embodiments, the at least two first electrode bars include the first polarity, and the at least two second electrode bars include the second polarity.

In some embodiments, the first electrode layer includes a first polarity and a second polarity, and the second electrode layer includes the first polarity and the second polarity. In some embodiments, the at least two first electrode bars include the first polarity and the second polarity, the at least two second electrode bars include the first polarity and the second polarity, and a pair of a first electrode bar and a second electrode bar disposed correspondingly at both sides of the second layer include the first polarity and the second polarity respectively. In some embodiments, the first polarity and the second polarity are arranged alternatively.

In some embodiments, the at least two first electrode bars include at least one first duty factor, and the at least one first duty factor has a value ranging from 0.1 to 1. It should be noted that the duty factor is defined as a value obtained by dividing a width of an electrode bar by an interval between two adjacent electrode bars. In some embodiments, the at least two second electrode bars include at least one second duty factor, and the at least one second duty factor has a value ranging from 0.1 to 1.

In some embodiments, two adjacent first electrode bars have a constant interval, and the interval includes a first interval. In some embodiments, two adjacent second electrode bars have a constant interval, and the interval includes a second interval.

In some embodiments, two adjacent first electrode bars have a variable interval, and the interval includes a third interval and a fourth interval. In some embodiments, two adjacent second electrode bars have a variable interval, and the interval includes a fifth interval and a sixth interval.

In some embodiments, the at least two first electrode bars have a constant width, and the width includes a first width.

In some embodiments, the at least two second electrode bars have a constant width, and the width includes a second width.

In some embodiments, the at least two first electrode bars have a variable width, and the width includes a third width and a fourth width. In some embodiments, the at least two second electrode bars have a variable width, and the width includes a fifth width and a sixth width.

In some embodiments, an overlap portion of the second electrode layer overlapping with the first electrode layer is disposed above the cavity, and a projection of the overlap portion along a direction perpendicular to the first layer falls within the cavity.

In some embodiments, the first electrode layer is made of one or more materials selected from a group consisting of molybdenum, ruthenium, tungsten, platinum, iridium and aluminum, and the second electrode layer is made of one or more materials selected from a group consisting of molybdenum, ruthenium, tungsten, platinum, iridium and aluminum.

In some embodiments, the first layer further includes an intermediate layer, and the intermediate layer includes the cavity. In some embodiments, the intermediate layer is made of one or more materials selected from a group consisting of polymer and insulating dielectric. In some embodiments, the polymer includes at least one selected from a group consisting of benzocyclobutene, photosensitive epoxy resin photoresist, and polyimide. In some embodiments, the insulating dielectric includes at least one selected from a group consisting of aluminum nitride, silicon dioxide, silicon nitride, and titanium oxide. In some embodiments, the intermediate layer has a thickness ranging from 0.1 micrometer to 10 micrometers.

In some embodiments, the first layer further includes a support layer, and the support layer includes the cavity. In some embodiments, the support layer is made of one or more materials selected from a group consisting of polymer and insulating dielectric. In some embodiments, the polymer includes at least one selected from a group consisting of benzocyclobutene (i.e., BCB), photosensitive epoxy resin photoresist (e.g., SU-8), and polyimide. In some embodiments, the insulating dielectric includes at least one selected from a group consisting of aluminum nitride, silicon dioxide, silicon nitride, and titanium oxide. In some embodiments, the support layer has a thickness ranging from 20 micrometers to 100 micrometers.

In some embodiments, the first layer further includes a first substrate, and the first substrate includes the cavity. In some embodiments, the first substrate is made of one or more materials selected from a group consisting of silicon, silicon carbide and glass.

In some embodiments, the first layer further includes an etch shield layer covering at least a bottom or a side wall of the cavity. In some embodiments, the etch shield layer is made of one or more materials selected from a group consisting of aluminum nitride, silicon carbide, diamond, silicon nitride, silicon dioxide, aluminum oxide and titanium dioxide. In some embodiments, the etch shield layer has a thickness ranging from 0.1 micrometer to 3 micrometers. In some embodiments, the etch shield layer has a thickness ranging from 2 micrometers to 6 micrometers. It should be noted that the etch shield layer may serve to protect the intermediate layer or the support layer or the first substrate when forming the cavity by etch. In addition, the etch shield layer may protect the resonance device from being corroded by water or oxygen.

In some embodiments, the second layer includes a piezoelectric layer, and the piezoelectric layer includes crystal grains. Crystal grains include a first crystal grain and a second crystal grain, and the first crystal grain and the second crystal grain are any two crystal grains of crystal grains. A first coordinate axis along a first direction corresponds to a height of the first crystal grain and a second coordinate axis along a second direction corresponds to a height of the second crystal grain. The first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first crystal grain corresponds to a first coordinate system including the first coordinate axis and a third coordinate axis along a third direction, and the second crystal grain corresponds to a second coordinate system including the second coordinate axis and a fourth coordinate axis along a fourth direction.

In some embodiments, the first coordinate system further includes a fifth coordinate axis along a fifth direction, and the second coordinate system further includes a sixth coordinate axis along a sixth direction.

In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the material of the piezoelectric layer includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the second layer includes a piezoelectric layer including crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the full width at half maximum (FWHM) refers to an interval between two points whose function values are equal to a half of a peak value of the function.

It should be noted that forming the piezoelectric layer on a plane may allow the piezoelectric layer not to include a crystal grain which suffers from a significant change to its orientation, thereby helping to increase the electromechanical coupling factor of the resonance device and the Q value of the resonance device.

In some embodiments, the resonance device further includes a second substrate disposed at a second side of the first layer, and the second side is opposite to the first side. In some embodiments, the material of the second substrate includes, but is not limited to, at least one of silicon, silicon carbide and glass. It should be noted that the acoustic impedance of the first layer may be smaller than that of the second layer to prevent waves propagating from the resonance region to the second substrate.

In some embodiments, the resonance device further includes a film disposed between the first layer and the second substrate. In some embodiments, the film includes, but is not limited to a polycrystalline film. In some embodiments, the material of the polycrystalline film includes, but is not limited to, at least one of polysilicon, polycrystalline silicon nitride, and polycrystalline silicon carbide. It should be noted that the film helps to prevent formation of a free electron layer on the surface of the second substrate, thereby reducing the electrical loss caused by the second substrate.

Embodiments of the present disclosure also provide a bulk acoustic wave filter device. The bulk acoustic wave filter device includes at least one bulk acoustic wave resonance device according to any one of above embodiments of the present disclosure.

BRIEF DESCRIPTION OF THE DRAWINGS

FIG. 14 (ii) illustrates a schematic structural view of a tetragonal crystal grain; and FIG. 14 (iii) illustrates a schematic structural view of a cubic crystal grain.

It should be noted that the cross-section A and the cross-section B are orthogonal to each other.

DETAILED DESCRIPTION

Embodiments of the present disclosure will be described in detail below in conjunction with the accompanying drawings.

In following description, specific details are set forth in order to provide a thorough understanding of the present disclosure, but the present disclosure may be practiced otherwise than as specifically described herein, and therefore the present disclosure is not limited by the specific embodiments disclosed below.

Figure 1A:
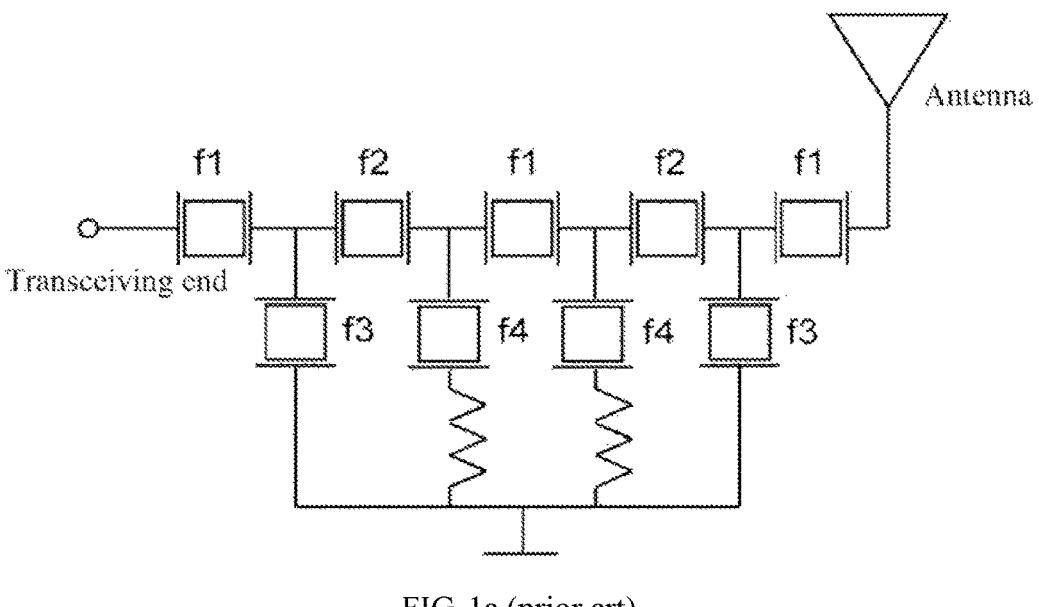
FIG. 1a illustrates a schematic view of a bulk acoustic wave filter circuit.
Figure 1B:
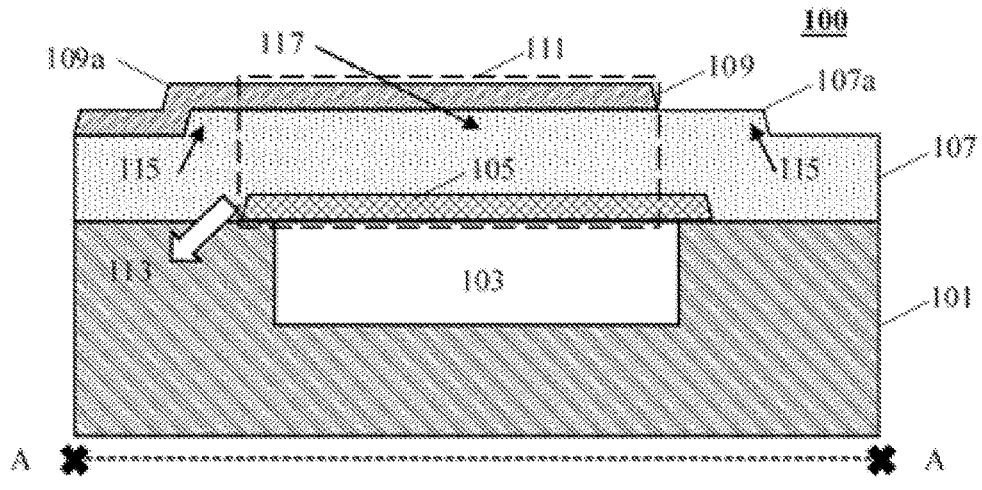
FIG. 1b illustrates a schematic structural view of a cross-section A of an FBAR 100.

As described in the background, with reference to FIG. 1B, the resonance region 111 is not suspended relative to the cavity 103, where the resonance region 111 not only overlaps with but also touches the substrate 101. If the acoustic impedance of the substrate 101 closes to the acoustic impedance of the piezoelectric layer 107, the energy of the resonance region 111 will spread to the non-resonance region and propagates into the substrate 101, thereby causing the Q value of the resonator to decrease. In addition, since the electrode layer 105 protrudes above the substrate 101, forming the piezoelectric layer 107 directly on the electrode layer 105 and the substrate 101 may cause some crystal grains in the piezoelectric layer 107 to suffer from a significant change to their orientation and thus to be not parallel to other crystal grains, thereby reducing the electromechanical coupling factor of the resonance device and the Q value of the resonance device. Furthermore, after the electrode layer 109 is formed, the frequency of the resonator is changed by modifying the thickness of the electrode layer.

It has been found that by adjusting positions of two electrode layers and a resonance region neither overlaps with nor touches an intermediate layer or a support layer or a first substrate, and the resonance region is suspended relative to a cavity of the intermediate layer or the support layer or the first substrate, difference between the acoustic impedance of the resonance region and that of a non-resonance region can be increased, thereby increasing the Q value of the resonance device.

It has also been found that by forming a piezoelectric layer on a flat surface, the piezoelectric layer does not include a crystal grain with significantly changed orientation, thereby improving the electromechanical coupling factor of the resonance device and the Q value of the resonance device.

It has also been found that when forming the two electrode layers, the working frequency of the resonance device can be changed by modifying a width of electrode bars or an interval between two adjacent electrode bars.

It has also been found that by providing the intermediate layer having a relatively smaller acoustic impedance than the piezoelectric layer, waves can be prevented from propagating from the resonance region into the substrate.

It has also been found that by providing a film between the intermediate layer and the substrate, a formation of a free electron layer on a surface of the substrate can be avoided, thereby reducing electrical loss caused by the substrate.

Embodiments of the present disclosure provide a bulk acoustic wave resonance device, including: a first layer including a cavity disposed at a first side of the first layer; a first electrode layer disposed in the cavity; a second layer disposed at the first side and disposed on the first electrode layer, and the second layer is a flat layer and covers the cavity; and a second electrode layer disposed at the first side and disposed on the second layer, and the first electrode layer includes at least two first electrode bars or the second electrode layer includes at least two second electrode bars.

It should be noted that by adjusting positions of the first electrode layer and the second electrode layer and a resonance region, that is an overlap region by the first electrode and the second electrode, neither overlaps with nor is in contact with the first layer, and the resonance region is suspended relative to the cavity, difference between the acoustic impedance of the resonance region and that of a non-resonance region can be increased, thereby increasing the Q value of the resonance device. Furthermore, when forming the first electrode layer or the second electrode layer, the frequency of the resonance device can be changed by modifying a width of the at least two first electrode bars or two adjacent second electrode bars or an interval between two adjacent first electrode bars or the at least two second electrode bars.

In some embodiments, the first electrode layer includes a first polarity and the second electrode layer includes a second polarity. In some embodiments, the at least two first electrode bars include the first polarity, and the at least two second electrode bars include the second polarity.

In some embodiments, the first electrode layer includes a first polarity and a second polarity, and the second electrode layer includes the first polarity and the second polarity. In some embodiments, the at least two first electrode bars include the first polarity and the second polarity, the at least two second electrode bars include the first polarity and the second polarity, and a pair of a first electrode bar and a second electrode bar disposed correspondingly at both sides of the second layer include the first polarity and the second polarity respectively. In some embodiments, the first polarity and the second polarity are arranged alternatively.

In some embodiments, the at least two first electrode bars include at least one first duty factor, and the at least one first duty factor has a value ranging from 0.1 to 1. It should be noted that the duty factor is defined as a value obtained by dividing a width of an electrode bar by an interval between two adjacent electrode bars. In some embodiments, the at least two second electrode bars include at least one second duty factor, and the at least one second duty factor has a value ranging from 0.1 to 1.

In some embodiments, two adjacent first electrode bars have a constant interval, and the interval includes a first interval. In some embodiments, two adjacent second electrode bars have a constant interval, and the interval includes a second interval. In some embodiments, two adjacent first electrode bars have a variable interval, and the interval includes a third interval and a fourth interval. In some embodiments, two adjacent second electrode bars have a variable interval, and the interval includes a fifth interval and a sixth interval.

In some embodiments, the at least two first electrode bars have a constant width, and the width includes a first width. In some embodiments, the at least two second electrode bars have a constant width, and the width includes a second width. In some embodiments, the at least two first electrode bars have a variable width, and the width includes a third width and a fourth width. In some embodiments, the at least two second electrode bars have a variable width, and the width includes a fifth width and a sixth width.

In some embodiments, an overlap portion of the second electrode layer overlapping with the first electrode layer is disposed above the cavity, and a projection of the overlap portion along a direction perpendicular to the first layer falls within the cavity.

In some embodiments, the first electrode layer is made of one or more materials selected from a group consisting of molybdenum, ruthenium, tungsten, platinum, iridium and aluminum, and the second electrode layer is made of one or more materials selected from a group consisting of molybdenum, ruthenium, tungsten, platinum, iridium and aluminum.

In some embodiments, the first layer further includes an intermediate layer, and the intermediate layer includes the cavity. In some embodiments, the intermediate layer is made of one or more materials selected from a group consisting of polymer and insulating dielectric. In some embodiments, the polymer includes at least one selected from a group consisting of benzocyclobutene, photosensitive epoxy resin photoresist, and polyimide. In some embodiments, the insulating dielectric includes at least one selected from a group consisting of aluminum nitride, silicon dioxide, silicon nitride, and titanium oxide. In some embodiments, the intermediate layer has a thickness ranging from 0.1 micrometer to 10 micrometers.

In some embodiments, the first layer further includes a support layer, and the support layer includes the cavity. In some embodiments, the support layer is made of one or more materials selected from a group consisting of polymer and insulating dielectric. In some embodiments, the polymer includes at least one selected from a group consisting of benzocyclobutene (i.e., BCB), photosensitive epoxy resin photoresist (e.g., SU-8), and polyimide. In some embodiments, the insulating dielectric includes at least one selected from a group consisting of aluminum nitride, silicon dioxide, silicon nitride, and titanium oxide. In some embodiments, the support layer has a thickness ranging from 20 micrometers to 100 micrometers.

In some embodiments, the first layer further includes a first substrate, and the first substrate includes the cavity. In some embodiments, the first substrate is made of one or more materials selected from a group consisting of silicon, silicon carbide and glass.

In some embodiments, the first layer further includes an etch shield layer covering at least a bottom or a side wall of the cavity. In some embodiments, the etch shield layer is made of one or more materials selected from a group consisting of aluminum nitride, silicon carbide, diamond, silicon nitride, silicon dioxide, aluminum oxide and titanium dioxide. In some embodiments, the etch shield layer has a thickness ranging from 0.1 micrometer to 3 micrometers. In some embodiments, the etch shield layer has a thickness ranging from 2 micrometers to 6 micrometers.

It should be noted that the etch shield layer may serve to protect the intermediate layer or the support layer or the first substrate when forming the cavity by etch. In addition, the etch shield layer may protect the resonance device from being corroded by water or oxygen.

In some embodiments, the second layer includes a piezoelectric layer, and the piezoelectric layer includes crystal grains. Crystal grains include a first crystal grain and a second crystal grain, and the first crystal grain and the second crystal grain are any two crystal grains of crystal grains. A first coordinate axis along a first direction corresponds to a height of the first crystal grain and a second coordinate axis along a second direction corresponds to a height of the second crystal grain. The first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first crystal grain corresponds to a first coordinate system including the first coordinate axis and a third coordinate axis along a third direction, and the second crystal grain corresponds to a second coordinate system including the second coordinate axis and a fourth coordinate axis along a fourth direction.

In some embodiments, the first coordinate system further includes a fifth coordinate axis along a fifth direction, and the second coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the material of the piezoelectric layer includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the second layer includes a piezoelectric layer including crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the full width at half maximum (FWHM) refers to an interval between two points whose function values are equal to a half of a peak value of the function.

It should be noted that forming the piezoelectric layer on a plane may allow the piezoelectric layer not to include a crystal grain which suffers from a significant change to its orientation, thereby helping to increase the electromechanical coupling factor of the resonance device and the Q value of the resonance device.

In some embodiments, the resonance device further includes a second substrate disposed at a second side of the first layer, and the second side is opposite to the first side. In some embodiments, the material of the second substrate includes, but is not limited to, at least one of silicon, silicon carbide and glass. It should be noted that the acoustic impedance of the first layer may be smaller than that of the second layer to prevent waves propagating from the resonance region to the second substrate.

In some embodiments, the resonance device further includes a film disposed between the first layer and the second substrate. In some embodiments, the film includes, but is not limited to a polycrystalline film. In some embodiments, the material of the polycrystalline film includes, but is not limited to, at least one of polysilicon, polycrystalline silicon nitride, and polycrystalline silicon carbide.

It should be noted that the film disposed between the first layer and the second substrate helps to prevent formation of a free electron layer on the surface of the second substrate, thereby reducing the electrical loss caused by the second substrate.

Embodiments of the present disclosure also provide a bulk acoustic wave filter device. The bulk acoustic wave filter device includes at least one bulk acoustic wave resonance device according to any one of above embodiments of the present disclosure.

Figure 2A:
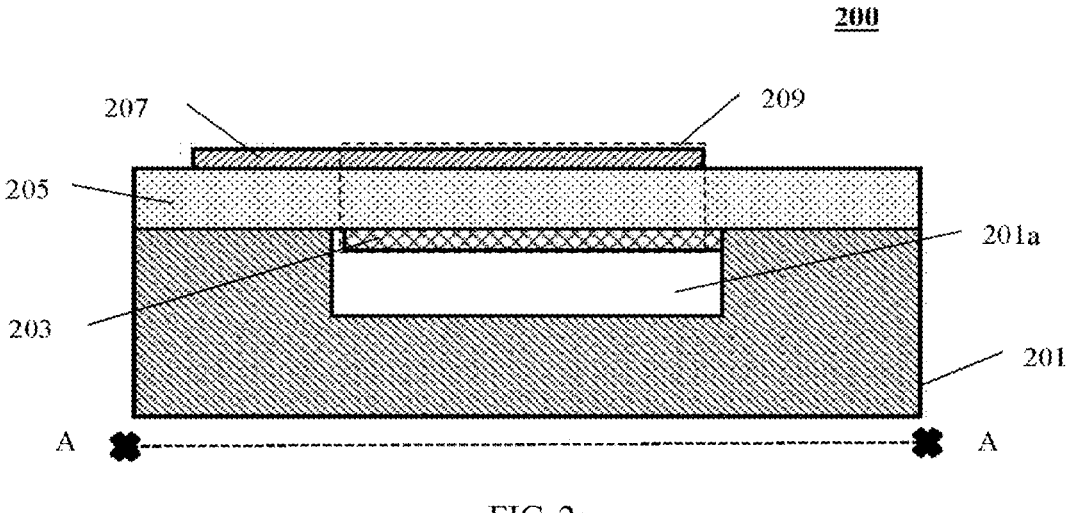
FIG. 2a illustrates a schematic structural view of a cross-section A of a bulk acoustic wave resonance device 200 according to an embodiment of the present disclosure.

FIG. 2a is a schematic structural view of a cross-section A of a bulk acoustic wave resonance device 200 according to an embodiment of the present disclosure.

As shown in FIG. 2a, embodiments of the present disclosure provide a bulk acoustic wave resonance device 200. The bulk acoustic wave resonance device 200 includes a substrate 201, an electrode layer 203, a piezoelectric layer 205 and an electrode layer 207. The substrate 201 includes a cavity 201a embedded at an upper surface of the substrate 201. A first end of the electrode layer 203 in the cross-section A is in contact with a side wall of the cavity 201a and a second end of the electrode layer 203 in the cross-section A is disposed within the cavity 201a. The piezoelectric layer 205 is disposed on the substrate 201 and the electrode layer 203. The piezoelectric layer 205 is a flat layer and covers the cavity 201a. The electrode layer 207 is disposed on the piezoelectric layer 205. As can be seen in FIG. 2a, a resonance region 209 (i.e., an overlap region of the electrode layer 203 and the electrode layer 207) is suspended relative to the cavity 201a, and neither overlaps with nor is in contact with the substrate 201. A perpendicular projection of the resonance region 209 perpendicular to the upper surface falls within the cavity 201a, which increases the difference between the acoustic impedance of the resonance region 209 and the acoustic impedance of the non-resonance region, thereby increasing the Q value of the resonance device.

In some embodiments, the material of the substrate 201 includes, but is not limited to, at least one of silicon, silicon carbide and glass.

In some embodiments, the piezoelectric layer 205 covers the upper surface of the substrate 201. In some embodiments, the material of the piezoelectric layer 205 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

Figure 13:
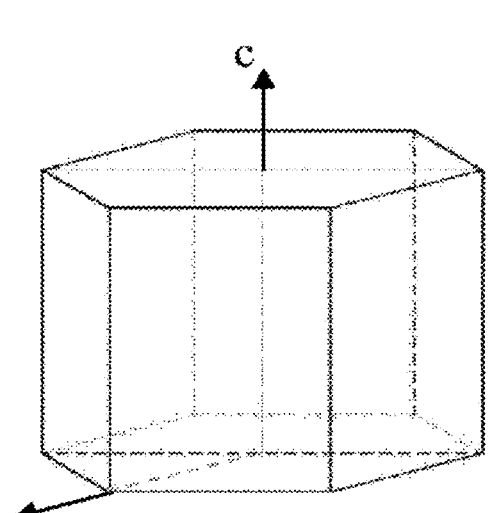
FIG. 13 illustrates a schematic structural view of a hexagonal crystal grain.
Figure 14:
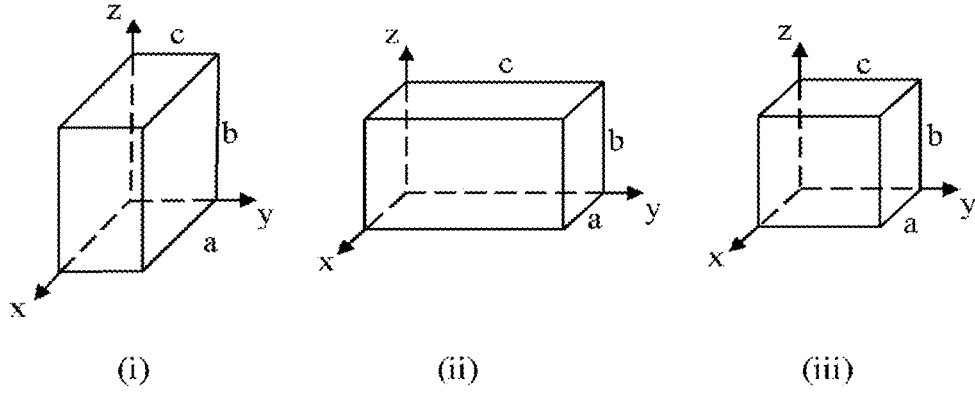
FIG. 14 (i) illustrates a schematic structural view of an orthorhombic crystal grain.

In some embodiments, the piezoelectric layer 205 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system ($a \neq b \neq c$), (ii) tetragonal system ($a = b \neq c$), (iii) cubic system ($a = b = c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 205 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 205 on a plane may allow the piezoelectric layer 205 not to include a crystal grain which suffers from a significant change to its orientation, thereby helping to increase the electromechanical coupling factor of the resonance device and the Q value of the resonance device.

In some embodiments, a portion of the electrode layer 203 overlapping with the electrode layer 207 is disposed within the cavity 201a, and a portion of the electrode layer 207 overlapping with the electrode layer 203 is disposed above the cavity 201a.

In some embodiments, the material of the electrode layer 203 includes, but is not limited to, at least one of molybdenum, ruthenium, tungsten, platinum, iridium and aluminum, and the material of the electrode layer 207 includes, but is not limited to, at least one of molybdenum, ruthenium, tungsten, platinum, iridium and aluminum.

In some embodiments, the electrode layer 203 includes a negative electrode and the electrode layer 207 includes a positive electrode. In some embodiments, the electrode layer 203 includes a positive electrode and the electrode layer 207 includes a negative electrode.

Figure 2B:
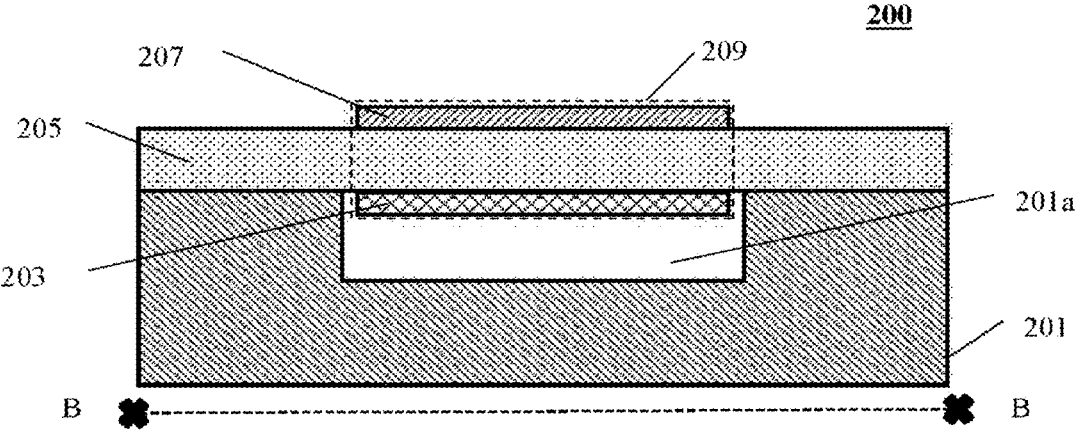
FIG. 2b illustrates a schematic structural view of a cross-section B of a bulk acoustic wave resonance device 200 according to an embodiment of the present disclosure.

FIG. 2b illustrates a schematic structural view of a cross-section B of a bulk acoustic wave resonance device 200 according to an embodiment of the present disclosure.

As shown in FIG. 2b, the substrate 201 includes the cavity 201a embedded at the upper surface of the substrate 201. The electrode layer 203 is disposed within the cavity 201a in the cross-section B. The piezoelectric layer 205 is disposed on the substrate 201 and the electrode layer 203. The electrode layer 207 is disposed on the piezoelectric layer 205. As can be seen in FIG. 2b, the resonance region 209 (i.e., the overlap region of the electrode layer 203 and the electrode layer 207) is suspended relative to the cavity 201a, and neither overlaps with nor is in contact with the substrate 201.

Figures 3A, 3B:
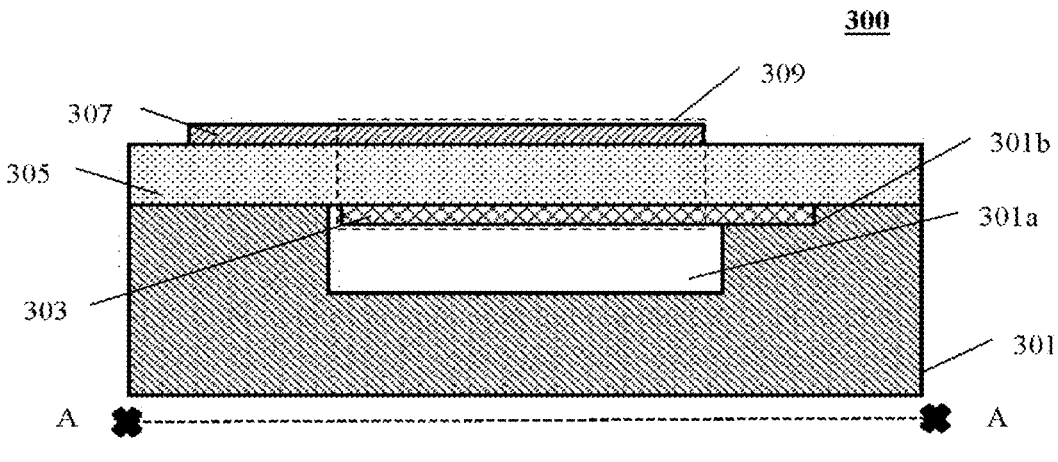
FIG. 3a illustrates a schematic structural view of a cross-section A of a bulk acoustic wave resonance device 300 according to an embodiment of the present disclosure.
FIG. 3b illustrates a schematic structural view of a cross-section B of a bulk acoustic wave resonance device 300 according to an embodiment of the present disclosure.

FIG. 3a is a schematic structural view of a cross-section A of a bulk acoustic wave resonance device 300 according to an embodiment of the present disclosure.

As shown in FIG. 3a, embodiments of the present disclosure provide a bulk acoustic wave resonance device 300. The bulk acoustic wave resonance device 300 includes a substrate 301, an electrode layer 303, a piezoelectric layer 305 and an electrode layer 307. The substrate 301 includes a cavity 301a and a groove 301b embedded at an upper surface of the substrate 301 in the cross-section A. The groove 301b is disposed adjacent to the cavity 301a in a horizontal direction and is communicated with the cavity 301a, and a depth of the groove 301b is less than a depth of the cavity 301a. A first end of the electrode layer 303 in the cross-section A is disposed within the groove 301b, a second end of the electrode layer 303 in the cross-section A is disposed within the cavity 301a, and the depth of the groove 301b is equal to a thickness of the electrode layer 303. The piezoelectric layer 305 is disposed on the substrate 301 and the electrode layer 303. The piezoelectric layer 305 is a flat layer and covers the cavity 301a. The electrode layer 307 is disposed on the piezoelectric layer 305. As can be seen in FIG. 3a, a resonance region 309 (i.e., an overlap region of the electrode layer 303 and the electrode layer 307) is suspended relative to the cavity 301a, and neither overlaps with nor is in contact with the substrate 301. Thus, a perpendicular projection of the resonance region 309 perpendicular to the upper surface falls within the cavity 301a, which increases the difference between the acoustic impedance of the resonance region 309 and the non-resonance region, thereby increasing the Q value of the resonance device.

In some embodiments, the material of the substrate 301 includes, but is not limited to, at least one of silicon, silicon carbide, and glass.

In some embodiments, the piezoelectric layer 305 covers the upper surface of the substrate 301. In some embodiments, the material of the piezoelectric layer 305 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 305 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 305 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 305 on a plane may allow the piezoelectric layer 305 not to include a crystal grain which suffers from a significant change to its orientation, thereby helping to increase the electromechanical coupling factor of the resonance device and the Q value of the resonance device.

In some embodiments, a portion of the electrode layer 303 overlapping with the electrode layer 307 is disposed within the cavity 301*a*, and a portion of the electrode layer 307 overlapping with the electrode layer 303 is disposed above the cavity 301*a*.

In some embodiments, the material of the electrode layer 303 includes, but is not limited to, at least one of molybdenum, ruthenium, tungsten, platinum, iridium and aluminum, and the material of the electrode layer 307 includes, but is not limited to, at least one of molybdenum, ruthenium, tungsten, platinum, iridium and aluminum.

In some embodiments, the electrode layer 303 includes a negative electrode and the electrode layer 307 includes a positive electrode. In some embodiments, the electrode layer 303 includes a positive electrode and the electrode layer 307 includes a negative electrode.

FIG. 3*b* illustrates a schematic structural view of a cross-section B of a bulk acoustic wave resonance device 300 according to an embodiment of the present disclosure.

As shown in FIG. 3*b*, the substrate 301 includes the cavity 301*a* embedded at the upper surface of the substrate 301 in the cross-section B. The electrode layer 303 includes four electrode bars 303*b* and is disposed within the cavity 301*a* in the cross-section B. The piezoelectric layer 305 is disposed on the substrate 301 and the electrode layer 303. The electrode layer 307 is disposed on the piezoelectric layer 305. As can be seen in FIG. 3*b*, the resonance region 309 (i.e., the overlap region of the electrode layer 303 and the electrode layer 307) is suspended relative to the cavity 301*a*, and neither overlaps with nor is in contact with the substrate 301.

In some embodiments, the four electrode bars 303*b* include a negative electrode, and the electrode layer 307 includes a positive electrode. In some embodiments, the four electrode bars 303*b* include a positive electrode, and the electrode layer 307 includes a negative electrode.

In some embodiments, an interval between two adjacent electrode bars 303b includes a first interval and a second interval, and the first interval is less than the second interval.

In some embodiments, the four electrode bars 303b have a constant width, and the width includes a first width.

In some embodiments, the four electrode bars 303b include a first duty factor corresponding to the first interval and the first width, and a second duty factor corresponding to the second interval and the first width, and the first duty factor and the second duty factor include, but is not limited to 0.1 to 1, and the first duty factor is greater than the second duty factor.

It should be noted that when forming the electrode layer 303, the working frequency of the resonance device can be changed by modifying the first interval or the second interval or the first width.

In some embodiments, the number of electrode bars included in the electrode layer 303 may be other even number, for example, 2, 6, 8, 10, 12, 14, 16, 18 and 20. In some embodiments, the number of electrode bars included in the electrode layer 303 may be an odd number, for example, 3, 5, 7, 9, 11, 13, 15, 17 and 19.

Figure 4A:
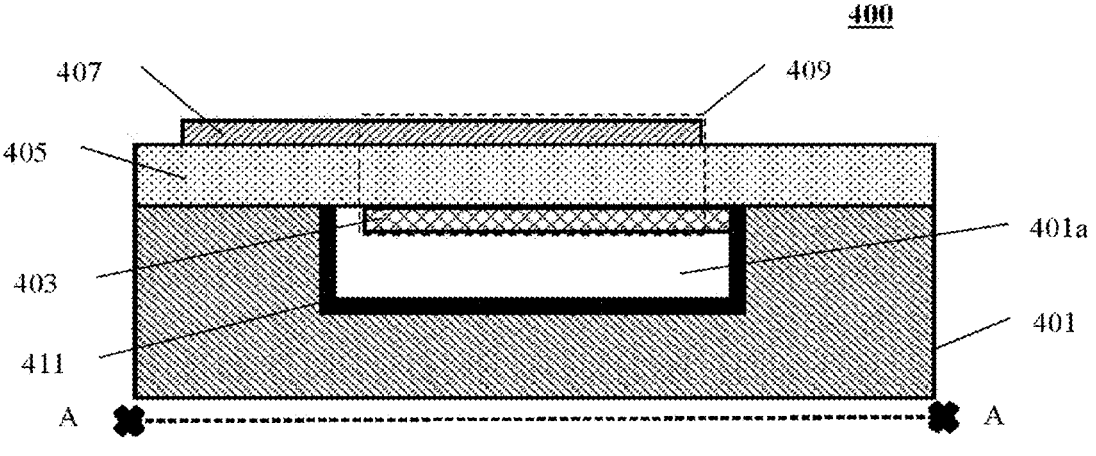
FIG. 4a illustrates a schematic structural view of a cross-section A of a bulk acoustic wave resonance device 400 according to an embodiment of the present disclosure.

FIG. 4a is a schematic structural view of a cross-section A of a bulk acoustic wave resonance device 400 according to an embodiment of the present disclosure.

As shown in FIG. 4a, embodiments of the present disclosure provide a bulk acoustic wave resonance device 400. The bulk acoustic wave resonance device 400 includes a substrate 401, an etch shield layer 411, an electrode layer 403, a piezoelectric layer 405 and an electrode layer 407. The substrate 401 includes a cavity 401a embedded at an upper surface of the substrate 401. The etch shield layer 411 is disposed within the cavity 401a and covers a bottom and a side wall of the cavity 401a. A first end of the electrode layer 403 in the cross-section A is in contact with the etch shield layer 411, and a second end of the electrode layer 403 in the cross-section A is disposed in the cavity 401a. The piezoelectric layer 405 is disposed on the substrate 401 and the electrode layer 403. The piezoelectric layer 405 is a flat layer and covers the cavity 401a. The electrode layer 407 is disposed on the piezoelectric layer 405. As can be seen in FIG. 4a, a resonance region 409 (i.e., an overlap region of the electrode layer 403 and the electrode layer 407) is suspended relative to the cavity 401a, and neither overlaps with nor is in contact with the substrate 401. A perpendicular projection of the resonance region 409 perpendicular to the upper surface is falls within the cavity 401a, which increase the difference between the acoustic impedance of the resonance region 409 and the acoustic impedance of the non-resonance region, thereby increasing the Q value of the resonance device.

In some embodiments, the material of the substrate 401 includes, but is not limited to, at least one of silicon, silicon carbide, and glass.

In some embodiments, the material of the etch shield layer 411 includes, but is not limited to, at least one of aluminum nitride, silicon carbide, diamond, silicon nitride, silicon dioxide, aluminum oxide, and titanium dioxide.

It should be noted that the etch shield layer 411 can serve to protect the substrate 401 when forming the cavity 401a by etch. In addition, the etch shield layer 411 may protect the resonance device from being corroded by water or oxygen.

In some embodiments, the thickness of the etch shield layer 411 includes, but is not limited to 0.1 micrometer to 3 micrometers. In some embodiments, the thickness of the etch shield layer 411 includes, but is not limited to 2 micrometers to 6 micrometers.

In some embodiments, the piezoelectric layer 405 covers the upper surface of the substrate 401. In some embodiments, the material of the piezoelectric layer 405 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 405 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system ($a \neq b \neq c$), (ii) tetragonal system ($a=b \neq c$), (iii) cubic system ($a=b=c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 405 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 405 on a plane may allow the piezoelectric layer 405 not to include a crystal grain which suffers from a significant change to its orientation, thereby helping to increase the electromechanical coupling factor of the resonance device and the Q value of the resonance device.

In some embodiments, a portion of the electrode layer 403 overlapping with the electrode layer 407 is disposed within the cavity 401a, and a portion of the electrode layer 407 overlapping with the electrode layer 403 is disposed above the cavity 401a.

In some embodiments, the material of the electrode layer 403 includes, but is not limited to, at least one of molybdenum, ruthenium, tungsten, platinum, iridium and aluminum, and the material of the electrode layer 407 includes, but is not limited to, at least one of molybdenum, ruthenium, tungsten, platinum, iridium and aluminum.

In some embodiments, the electrode layer 403 includes a negative electrode and the electrode layer 407 includes a positive electrode. In some embodiments, the electrode layer 403 includes a positive electrode and the electrode layer 407 includes a negative electrode.

Figure 4B:
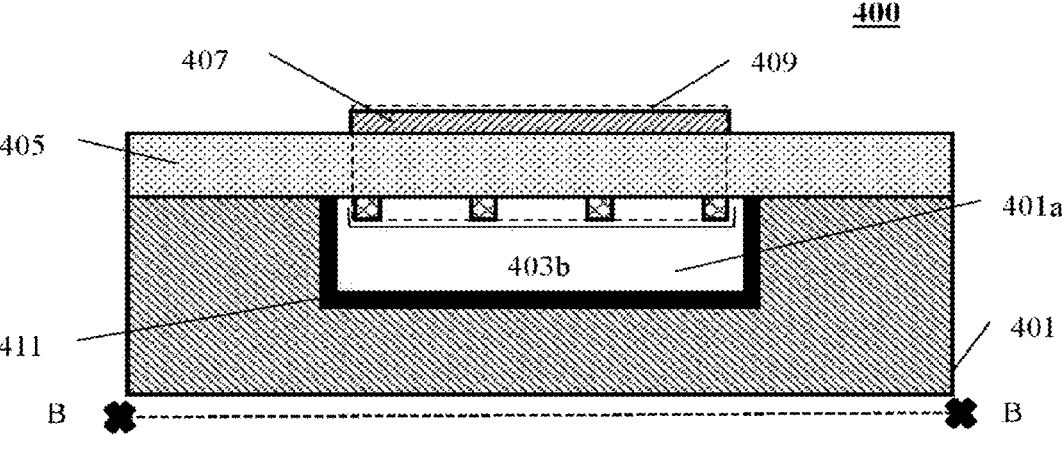
FIG. 4b illustrates a schematic structural view of a cross-section B of a bulk acoustic wave resonance device 400 according to an embodiment of the present disclosure.

FIG. 4b illustrates a schematic structural view of a cross-section B of a bulk acoustic wave resonance device 400 according to an embodiment of the present disclosure.

As shown in FIG. 4b, the substrate 401 includes the cavity 401a embedded at the upper surface of the substrate 401. The etch shield layer 411 is disposed within the cavity 401a and covers the bottom and the side wall of the cavity 401a.

The electrode layer 403 includes four electrode bars 403b and is disposed within the cavity 401a in the cross-section B. The piezoelectric layer 405 is disposed on the substrate 401 and the electrode layer 403. The electrode layer 407 is disposed on the piezoelectric layer 405. As can be seen in FIG. 4b, the resonance region 409 (i.e., the overlap region of the electrode layer 403 and the electrode layer 407) is suspended relative to the cavity 401a, and neither overlaps with nor is in contact with the substrate 401.

In some embodiments, the four electrode bars 403b include a negative electrode, and the electrode layer 407 includes a positive electrode. In some embodiments, the four electrode bars 403b include a positive electrode, and the electrode layer 407 includes a negative electrode.

In some embodiments, an interval between two adjacent electrode bars 403b is constant, and the interval includes a first interval.

In some embodiments, a width of the four electrode bars 403b is constant, and the width includes a first width.

In some embodiments, the four electrode bars 403b include a first duty factor corresponding to the first interval and the first width, and the first duty factor includes, but is not limited to 0.1 to 1.

It should be noted that when forming the electrode layer 403, the working frequency of the resonance device can be changed by modifying the first interval or the first width.

In some embodiments, the number of electrode bars included in the electrode layer 403 may be other even number, for example, 2, 6, 8, 10, 12, 14, 16, 18 and 20. In some embodiments, the number of electrode bars included in the electrode layer 403 may be an odd number, for example, 3, 5, 7, 9, 11, 13, 15, 17 and 19.

Figure 5A:
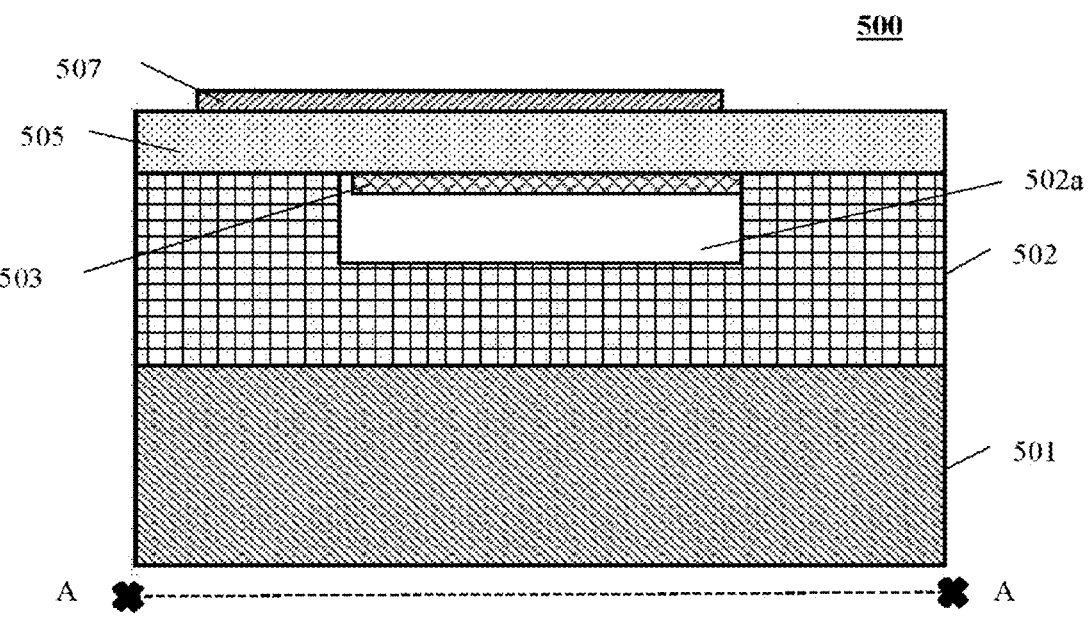
FIG. 5a illustrates a schematic structural view of a cross-section A of a bulk acoustic wave resonance device 500 according to an embodiment of the present disclosure.

FIG. 5a is a schematic structural view of a cross-section A of a bulk acoustic wave resonance device 500 according to an embodiment of the present disclosure.

As shown in FIG. 5a, embodiments of the present disclosure provide a bulk acoustic wave resonance device 500. The bulk acoustic wave resonance device 500 includes a substrate 501, an intermediate layer 502, an electrode layer 503, a piezoelectric layer 505 and an electrode layer 507. The intermediate layer 502 is disposed on the substrate 501, and includes a cavity 502a embedded at an upper surface of the intermediate layer 502. A first end of the electrode layer 503 in the cross-section A is in contact with a side wall of the cavity 502a, and a second end of the electrode layer 503 in the cross-section A is disposed within the cavity 502a. The piezoelectric layer 505 is disposed on the intermediate layer 502 and the electrode layer 503. The piezoelectric layer 505 is a flat layer and covers the cavity 502a. The electrode layer 507 is disposed on the piezoelectric layer 505. As can be seen in FIG. 5a, a resonance region (not shown, i.e., an overlap region of the electrode layer 503 and the electrode layer 507) is suspended relative to the cavity 502a, and neither overlaps with nor is in contact with the intermediate layer 502. Thus, a perpendicular projection of the resonance region (not shown) perpendicular to the upper surface falls within the cavity 502a.

Therefore, embodiments of the present disclosure may increase the difference between the acoustic impedance of the resonance region (not shown) and the non-resonance region, thereby increasing the Q value of the resonance device. In addition, the acoustic impedance of the intermediate layer 502 may be relatively smaller than that of the piezoelectric layer 505, thereby preventing waves propagating from the resonance region (not shown) to the substrate 501.

In some embodiments, the material of the substrate 501 includes, but is not limited to, at least one of silicon, silicon carbide, and glass.

In some embodiments, the material of the intermediate layer 502 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 502 includes, but is not limited to 0.1 micrometer to 10 micrometers.

In some embodiments, the piezoelectric layer 505 covers the upper surface of the substrate 501. In some embodiments, the material of the piezoelectric layer 505 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 505 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 505 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 505 on a plane may allow the piezoelectric layer 505 not to include a crystal grain which suffers from a significant change to its orientation, thereby helping to increase the electromechanical coupling factor of the resonance device and the Q value of the resonance device.

In some embodiments, a portion of the electrode layer 503 overlapping with the electrode layer 507 is disposed within the cavity 502a, and a portion of the electrode layer 507 overlapping with the electrode layer 503 is disposed above the cavity 502a.

In some embodiments, the material of the electrode layer 503 includes, but is not limited to, at least one of molybdenum, ruthenium, tungsten, platinum, iridium and aluminum, and the material of the electrode layer 507 includes, but is not limited to, at least one of molybdenum, ruthenium, tungsten, platinum, iridium and aluminum.

In some embodiments, the electrode layer 503 includes a negative electrode and the electrode layer 507 includes a positive electrode. In some embodiments, the electrode layer 503 includes a positive electrode and the electrode layer 507 includes a negative electrode.

Figure 5B:
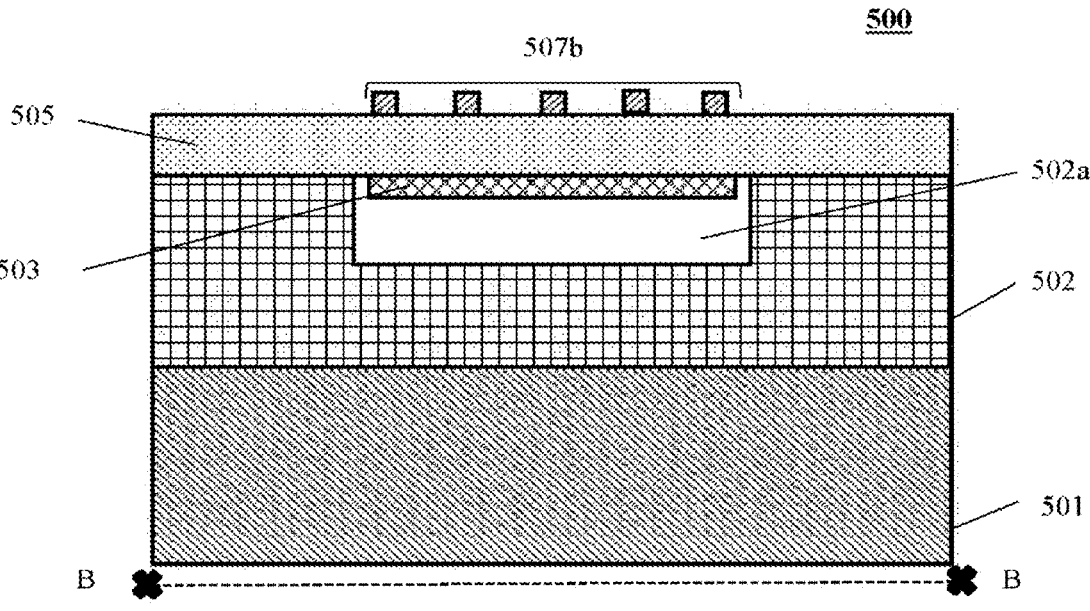
FIG. 5b illustrates a schematic structural view of a cross-section B of a bulk acoustic wave resonance device 500 according to an embodiment of the present disclosure.

FIG. 5b illustrates a schematic structural view of a cross-section B of a bulk acoustic wave resonance device 500 according to an embodiment of the present disclosure.

As shown in FIG. 5b, the intermediate layer 502 is disposed on the substrate 501, and the intermediate layer 502 includes the cavity 502a embedded at the upper surface of the intermediate layer 502. The electrode layer 503 is disposed within the cavity 502a in the cross-section B. The piezoelectric layer 505 is disposed on the intermediate layer 502 and the electrode layer 503. The electrode layer 507 includes five electrode bars 507b, and the electrode layer 507 is disposed on the piezoelectric layer 505. As can be seen in FIG. 5b, the resonance region (not shown, i.e., the overlap region of the electrode layer 503 and the electrode layer 507) is suspended relative to the cavity 502a, and neither overlaps with nor is in contact with the intermediate layer 502. Thus, the perpendicular projection of the resonance region perpendicular to the upper surface falls within the cavity 502a.

In some embodiments, the electrode layer 503 includes a negative electrode, and the five electrode bars 507b include a positive electrode. In some embodiments, the electrode layer 503 includes a positive electrode, and the five electrode bars 507b include a negative electrode.

In some embodiments, an interval between two adjacent electrode bars 507b is constant, and the interval includes a first interval.

In some embodiments, a width of the five electrode bars 507b is constant, and the width includes a first width.

In some embodiments, the five electrode bars 507b include a first duty factor corresponding to the first interval and the first width, and the first duty factor includes, but is not limited to 0.1 to 1.

It should be noted that when forming the electrode layer 507, the working frequency of the resonance device can be changed by modifying the first interval or the first width.

In some embodiments, the number of electrode bars included in the electrode layer 507 may be other odd number, for example, 3, 7, 9, 11, 13, 15, 17 and 19. In some embodiments, the number of electrode bars included in the electrode layer 507 may be an even number, for example, 2, 4, 6, 8, 10, 12, 14, 16, 18 and 20.

Figure 6A:
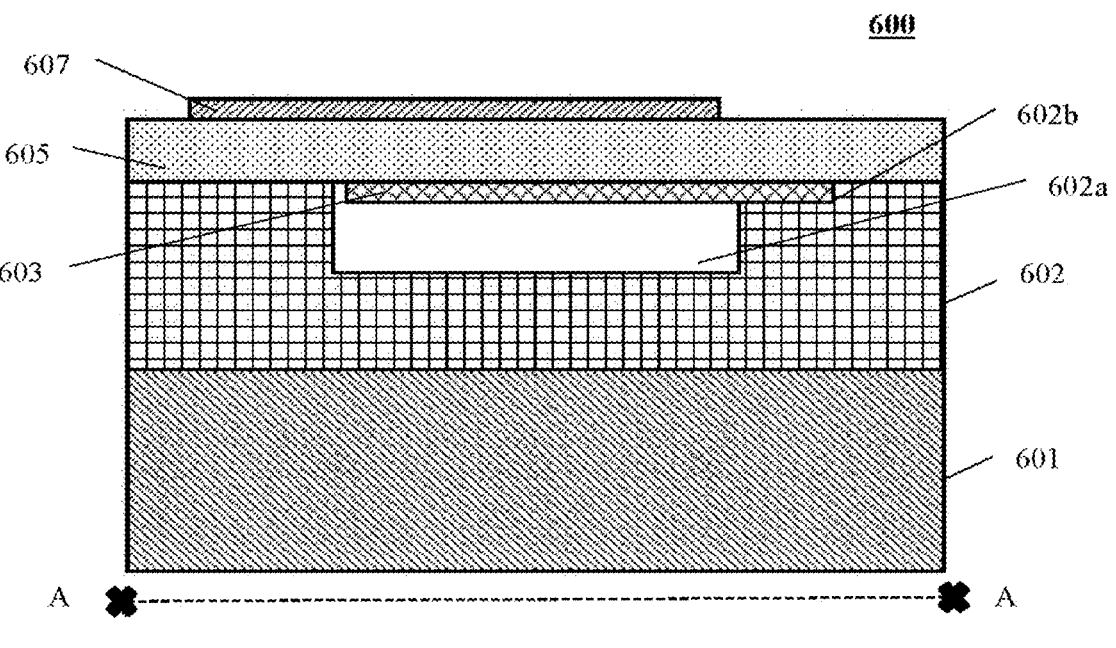
FIG. 6a illustrates a schematic structural view of a cross-section A of a bulk acoustic wave resonance device 600 according to an embodiment of the present disclosure.

FIG. 6a is a schematic structural view of a cross-section A of a bulk acoustic wave resonance device 600 according to an embodiment of the present disclosure.

As shown in FIG. 6a, embodiments of the present disclosure provide a bulk acoustic wave resonance device 600. The bulk acoustic wave resonance device 600 includes a substrate 601, an intermediate layer 602, an electrode layer 603, a piezoelectric layer 605 and an electrode layer 607. The intermediate layer 602 is disposed on the substrate 601, and includes a cavity 602a and a groove 602b embedded at an upper surface of the intermediate layer 602 in the cross-section A. The groove 602b is disposed adjacent to the cavity 602a in a horizontal direction and communicated with the cavity 602a, and a depth of the groove 602b is less than a depth of the cavity 602a. A first end of the electrode layer 603 is disposed within the groove 602b in the cross-section A, a second end of the electrode layer 603 is disposed within the cavity 602a in the cross-section A, and the depth of the groove 602b is equal to a thickness of the electrode layer 603. The piezoelectric layer 605 is disposed on the intermediate layer 602 and the electrode layer 603. The piezoelectric layer 605 is a flat layer and covers the cavity 602a. The electrode layer 607 is disposed on the piezoelectric layer 605. As can be seen in FIG. 6a, a resonance region (not shown, i.e., an overlap region of the electrode layer 603 and the electrode layer 607) is suspended relative to the cavity 602a, and neither overlaps with nor is in contact with the intermediate layer 602, thus a perpendicular projection of the resonance region (not shown) perpendicular to the upper surface falls within the cavity 602a.

Embodiments of the present disclosure may increase the difference between the acoustic impedance of the resonance region (not shown) and the acoustic impedance of non-resonance region, thereby increasing the Q value of the resonance device. In addition, the acoustic impedance of the intermediate layer 602 may be relatively smaller than that of the piezoelectric layer 605, thereby preventing waves propagating from the resonance region (not shown) to the substrate 601.

In some embodiments, the material of the substrate 601 includes, but is not limited to, at least one of silicon, silicon carbide, and glass.

In some embodiments, the material of the intermediate layer 602 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 602 includes, but is not limited to 0.1 micrometer to 10 micrometers.

In some embodiments, the piezoelectric layer 605 covers the upper surface of the substrate 601. In some embodiments, the material of the piezoelectric layer 605 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 605 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system ($a \neq b \neq c$), (ii) tetragonal system ($a=b \neq c$), (iii) cubic system ($a=b=c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 605 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 605 on a plane may allow the piezoelectric layer 605 not to include a crystal grain which suffers from a significant change to its orientation, thereby helping to increase the electromechanical coupling factor of the resonance device and the Q value of the resonance device.

In some embodiments, a portion of the electrode layer 603 overlapping with the electrode layer 607 is disposed within the cavity 602a, and a portion of the electrode layer 607 overlapping with the electrode layer 603 is disposed above the cavity 602a.

In some embodiments, the material of the electrode layer 603 includes, but is not limited to, at least one of molybdenum, ruthenium, tungsten, platinum, iridium and aluminum, and the material of the electrode layer 607 includes, but is not limited to, at least one of molybdenum, ruthenium, tungsten, platinum, iridium and aluminum.

In some embodiments, the electrode layer 603 includes a negative electrode and the electrode layer 607 includes a positive electrode. In some embodiments, the electrode layer 603 includes a positive electrode and the electrode layer 607 includes a negative electrode.

Figure 6B:
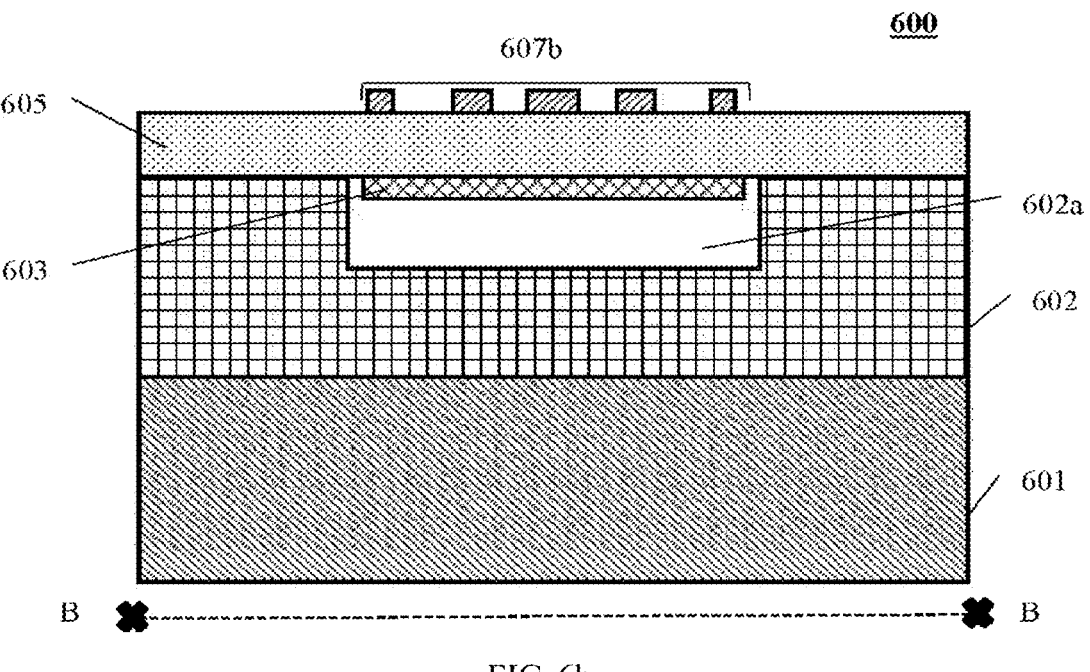
FIG. 6b illustrates a schematic structural view of a cross-section B of a bulk acoustic wave resonance device 600 according to an embodiment of the present disclosure.

FIG. 6b illustrates a schematic structural view of a cross-section B of a bulk acoustic wave resonance device 600 according to an embodiment of the present disclosure.

As shown in FIG. 6b, the intermediate layer 602 is disposed on the substrate 601, and the intermediate layer 602 includes a cavity 602a embedded at the upper surface of the intermediate layer 602 in the cross-section B. The electrode layer 603 is disposed within the cavity 602a in the cross-section B. The piezoelectric layer 605 is disposed on the intermediate layer 602 and the electrode layer 603. The electrode layer 607 includes five electrode bars 607b, and the electrode layer 607 is disposed on the piezoelectric layer 605. As can be seen in FIG. 6b, the resonance region (not shown, that is, the overlap region of the electrode layer 603 and the electrode layer 607) is suspended relative to the cavity 602a, and neither overlaps with nor is in contact with the intermediate layer 602, and the perpendicular projection of the resonance region (not shown) perpendicular to the upper surface falls within the cavity 602a.

In some embodiments, the electrode layer 603 includes a negative electrode, and the five electrode bars 607b include a positive electrode. In some embodiments, the electrode layer 603 includes a positive electrode, and the five electrode bars 607b include a negative electrode.

In some embodiments, an interval between two adjacent electrode bars 607b is variable, and the interval includes a first interval and a second interval, and the first interval is greater than the second interval.

In some embodiments, a width of the five electrode bars 607b is variable, and the width includes a first width, a second width and a third width, and the first width is smaller than the second width, and the second width is smaller than the third width.

In some embodiments, the duty factor of the five electrode bars 607b includes a first duty factor corresponding to the first interval and the first width, a second duty factor corresponding to the first interval and the second width, a third duty factor corresponding to the second interval and the second width, and a fourth duty factor corresponding to the second interval and the third width, and the first duty factor, the second duty factor, the third duty factor and the fourth duty factor include, but are not limited to, 0.1 to 1.

It should be noted that when forming the electrode layer 607, the working frequency of the resonance device can be changed by modifying the first interval, or the second interval, or the first width, or the second width, or the third width.

In some embodiments, the number of electrode bars included in the electrode layer 607 may be other odd number, for example, 3, 7, 9, 11, 13, 15, 17 and 19. In some embodiments, the number of electrode bars included in the electrode layer 607 may be an even number, for example, 2, 4, 6, 8, 10, 12, 14, 16, 18 and 20.

Figure 7A:
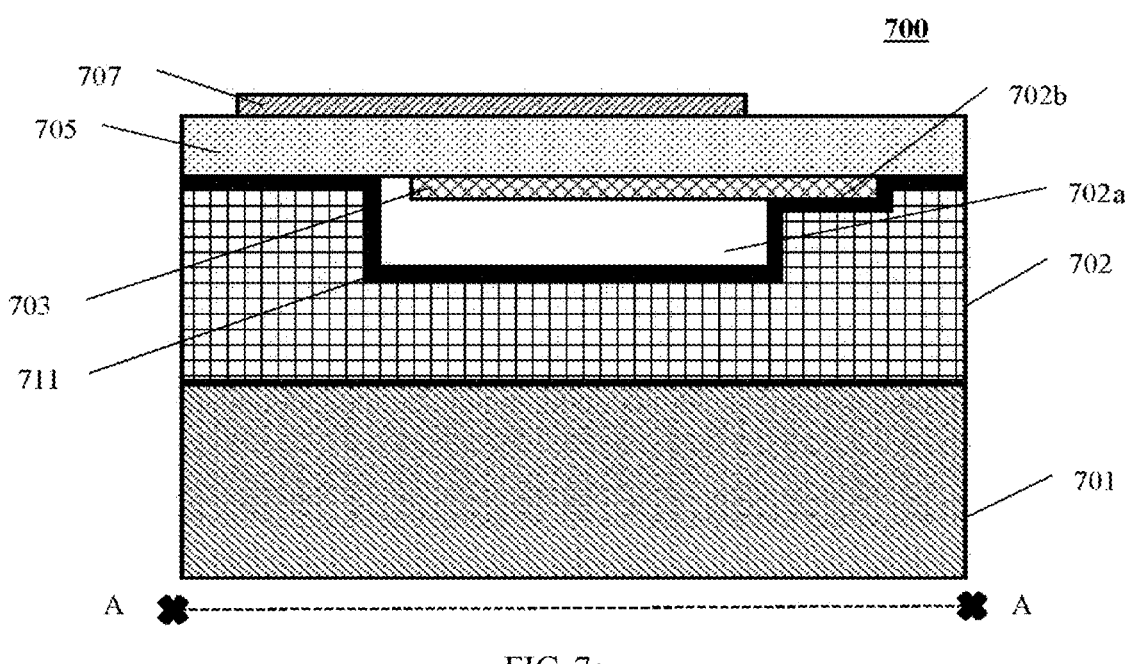
FIG. 7a illustrates a schematic structural view of a cross-section A of a bulk acoustic wave resonance device 700 according to an embodiment of the present disclosure.

FIG. 7a is a schematic structural view of a cross-section A of a bulk acoustic wave resonance device 700 according to an embodiment of the present disclosure.

As shown in FIG. 7a, embodiments of the present disclosure provide a bulk acoustic wave resonance device 700. The bulk acoustic wave resonance device 700 includes a substrate 701, an intermediate layer 702, an etch shield layer 711, an electrode layer 703, a piezoelectric layer 705, and an electrode layer 707. The intermediate layer 702 is disposed on the substrate 701, and includes a cavity 702a and a groove 702b embedded at an upper surface of the intermediate layer 702 in the cross-section A. The groove 702b is disposed adjacent to the cavity 702a in a horizontal direction and communicated with the cavity 702a, and a depth of the groove 702b is less than a depth of the cavity 702a. The etch shield layer 711 covers a bottom and a side wall of the cavity 702a, a bottom and a side wall of the groove 702b, and the upper surface of the intermediate layer 702 in the cross-section A. A first end of the electrode layer 703 in the cross-section A is disposed within the groove 702b, a second end of the electrode layer 703 in the cross-section A is disposed within the cavity 702a, and the depth of the groove 702b is equal to the sum of a thickness of the etch shield layer 711 and a thickness of the electrode layer 703. The piezoelectric layer 705 is disposed on the etch shield layer 711 and the electrode layer 703. The piezoelectric layer 705 is a flat layer and covers the cavity 702a. The electrode layer 707 is disposed on the piezoelectric layer 705. As can be seen in FIG. 7a, a resonance region (not shown, i.e., an overlap region of the electrode layer 703 and the electrode layer 707) is suspended relative to the cavity 702a, and neither overlaps with nor is in contact with the intermediate layer 702 and the etch shield layer 711, thus a perpendicular projection of the resonance region (not shown) perpendicular to the upper surface falls within the cavity 702a.

Embodiments of the present disclosure may increase the difference between the acoustic impedance of the resonance region (not shown) and the acoustic impedance of non-resonance region, thereby increasing the Q value of the resonance device. In addition, the acoustic impedance of the intermediate layer 702 may be relatively smaller than that of the piezoelectric layer 705, thereby preventing waves propagating from the resonance region (not shown) to the substrate 701.

In some embodiments, the material of the substrate 701 includes, but is not limited to, at least one of silicon, silicon carbide, and glass.

In some embodiments, the material of the intermediate layer 702 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 702 includes, but is not limited to 0.1 micrometer to 10 micrometers.

In some embodiments, the material of the etch shield layer 711 includes, but is not limited to, at least one of aluminum nitride, silicon carbide, diamond, silicon nitride, silicon dioxide, aluminum oxide, and titanium dioxide.

It should be noted that the etch shield layer 711 may serve to protect the intermediate layer 702 when forming the cavity 702a by etch. In addition, the etch shield layer 711 may protect the resonance device from being corroded by water or oxygen.

In some embodiments, the thickness of the etch shield layer 711 includes, but is not limited to: 0.1 micrometer to 3 micrometers.

In some embodiments, the piezoelectric layer 705 covers the etch shield layer 711. In some embodiments, the material of the piezoelectric layer 705 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 705 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 705 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 705 on a plane may allow the piezoelectric layer 705 not to include a crystal grain which suffers from a significant change to its orientation, thereby helping to increase the electromechanical coupling factor of the resonance device and the Q value of the resonance device.

In some embodiments, a portion of the electrode layer 703 overlapping with the electrode layer 707 is disposed within the cavity 702a, and a portion of the electrode layer 707 overlapping with the electrode layer 703 is disposed above the cavity 702a.

In some embodiments, the material of the electrode layer 703 includes, but is not limited to, at least one of molybdenum, ruthenium, tungsten, platinum, iridium and aluminum, and the material of the electrode layer 707 includes, but is not limited to, at least one of molybdenum, ruthenium, tungsten, platinum, iridium and aluminum.

In some embodiments, the electrode layer 703 includes a positive electrode and a negative electrode, and the electrode layer 707 includes a positive electrode and a negative electrode.

Figure 7B:
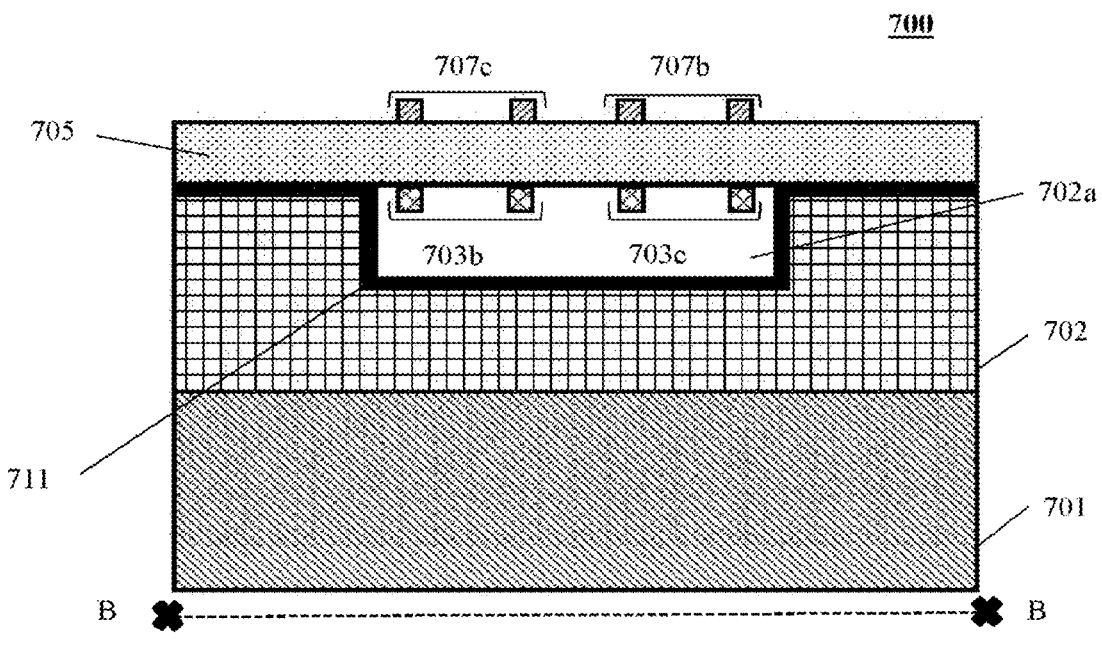
FIG. 7b illustrates a schematic structural view of a cross-section B of a bulk acoustic wave resonance device 700 according to an embodiment of the present disclosure.

FIG. 7b is a schematic structural view of a cross-section B of a bulk acoustic wave resonance device 700 according to an embodiment of the present disclosure.

As shown in FIG. 7b, the intermediate layer 702 is disposed on the substrate 701, and the intermediate layer 702 includes the cavity 702a embedded at the upper surface of the intermediate layer 702 in the cross-section B. The etch shield layer 711 covers the bottom and the side wall of the cavity 702a and the upper surface of the intermediate layer 702 in the cross-section B. The electrode layer 703 includes two electrode bars 703b and two electrode bars 703c, and electrode layer 703 is disposed within the cavity 702a in the cross-section B. The piezoelectric layer 705 is disposed on the etch shield layer 711 and the electrode layer 703. The electrode layer 707 includes two electrode bars 707b and two electrode bars 707c, and the electrode layer 707 is disposed on the piezoelectric layer 705. As can be seen in FIG. 7b, the resonance region (not shown, that is, the overlap region of the electrode layer 703 and the electrode layer 707) is suspended relative to the cavity 702a and neither overlaps with nor is in contact with the intermediate layer 702, and the perpendicular projection of the resonance region (not shown) perpendicular to the upper surface falls within cavity 702a.

In some embodiments, the two electrode bars 703b include a negative electrode and the two electrode bars 703c include a positive electrode, and the two electrode bars 707b include a negative electrode and the two electrode bars 707c include a positive electrode. In some embodiments, the two electrode layers 703b include a positive electrode and the two electrode layers 703c include a negative electrode, and the two electrode bars 707b include a positive electrode and the two electrode bars 707c include a negative electrode.

In some embodiments, an interval between the two electrode bars 703b, an interval between the two electrode bars 703c and an interval between the two electrode bars 703b and the two electrode bars 703c are constant, which include a first interval.

In some embodiments, correspondingly, an interval between the two electrode bars 707b, an interval between the two electrode bars 707c and an interval between the two electrode bars 707b and the two electrode bars 707c are constant, which include a second interval, and the first interval is equal or close to the second interval.

In some embodiments, a width of the two electrode bars 703b and a width of the two electrode bars 703c are constant, which include a first width.

In some embodiments, a width of the two electrode bars 707b and a width of the two electrode bars 707c are constant, which include a second width, and the first width is equal or close to the second width.

In some embodiments, the duty factor between the two electrode bars 703b includes a first duty factor corresponding to the first interval and the first width, and the first duty factor includes, but is not limited to 0.1 to 1. In some embodiments, the duty factor between the two electrode bars 703c includes the first duty factor. In some embodiments, the duty factor between the two electrode bars 703b and the two electrode bars 703c includes the first duty factor.

In some embodiments, correspondingly, the duty factor between the two electrode bars 707b includes the first duty factor. In some embodiments, correspondingly, the duty factor between the two electrode bars 707c includes the first duty factor. In some embodiments, correspondingly, the duty factor between the two electrode bars 707b and the two electrode bars 707c includes the first duty factor.

It should be noted that when forming the electrode layers 703 and 707, the working frequency of the resonance device can be changed by modifying the first interval or the first width.

In some embodiments, the number of electrode bars included in the electrode layers 703 and 707 may be other even number, such as 2, 6, 8, 10, 12, 14, 16, 18 and 20. In some embodiments, the number of electrode bars included in the electrode layers 703 and 707 may be an odd number, such as 3, 5, 7, 9, 11, 13, 15, 17 and 19.

In some embodiments, the electrode layer 703 includes six electrode bars, and the electrode layer 707 also includes six electrode bars, and the polarity of the six electrode bars included in the electrode layer 703 is negative, negative, positive, positive, negative and negative from left to right along a horizontal direction, and the polarity of the six electrode bars included in the electrode layer 707 is positive, positive, negative, negative, positive and positive from left to right along the horizontal direction. In some embodiments, the polarity of the six electrode bars included in the electrode layer 703 is negative, negative, negative, positive, positive and positive from left to right along the horizontal direction, and the polarity of the six electrode bars included in the electrode layer 707 is positive, positive, positive, negative, negative and negative from left to right along the horizontal direction.

In some embodiments, the electrode layer 703 includes five electrode bars, and the electrode layer 707 also includes five electrode bars. The polarity of the five electrode bars included in the electrode layer 703 is negative, negative, positive, negative and negative from left to right in the horizontal direction, and the polarity of the five electrode bars included in the electrode layer 707 is positive, positive, negative, positive and positive from left to right along the horizontal direction. In some embodiments, the polarity of the five electrode bars included in the electrode layer 703 is negative, negative, negative, positive and positive from left to right along the horizontal direction, and the polarity of the five electrode bars included in the electrode layer 707 is positive, positive, positive, negative and negative from left to right along the horizontal direction.

Figure 8A:
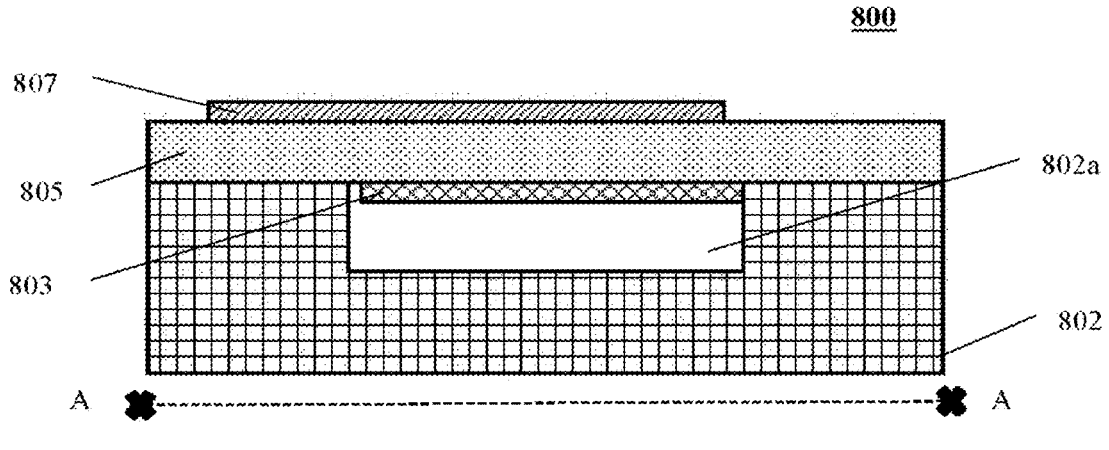
FIG. 8a illustrates a schematic structural view of a cross-section A of a bulk acoustic wave resonance device 800 according to an embodiment of the present disclosure.

FIG. 8a is a schematic structural view of a cross-section A of a bulk acoustic wave resonance device 800 according to an embodiment of the present disclosure.

As shown in FIG. 8a, embodiments of the present disclosure provide a bulk acoustic wave resonator device 800. The bulk acoustic wave resonator device 800 includes a support layer 802, an electrode layer 803, a piezoelectric layer 805 and an electrode layer 807. The support layer 802 includes a cavity 802a embedded at an upper surface of the support layer 802. A first end of the electrode layer 803 in the cross-section A is in contact with a side wall of the cavity 802a, and a second end of the electrode layer 803 in the cross-section A is disposed within the cavity 802a. The piezoelectric layer 805 is disposed on the support layer 802 and the electrode layer 803. The piezoelectric layer 805 is a flat layer and covers the cavity 802a. The electrode layer 807 is disposed on the piezoelectric layer 805. As can be seen in FIG. 8a, a resonance region (not shown, i.e., an overlap region of the electrode layer 803 and the electrode layer 807) is suspended relative to the cavity 802a, and neither overlaps with nor is in contact with the support layer 802, and a perpendicular projection of the resonance region (not shown) perpendicular to the upper surface falls within the cavity 802a.

Embodiments of the present disclosure may increase the difference between the acoustic impedance of the resonance region (not shown) and the acoustic impedance of the non-resonance region, thereby increasing the Q value of the resonance device. In addition, the resonance device 800 according to the present disclosure does not include a substrate, thereby eliminating electrical losses caused by the substrate.

In some embodiments, the material of the support layer 802 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the support layer 802 includes, but is not limited to 20 micrometers to 100 micrometers.

In some embodiments, the piezoelectric layer 805 covers the upper surface of the support layer 802. In some embodiments, the material of the piezoelectric layer 805 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 805 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 805 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 805 on a plane may allow the piezoelectric layer 805 not to include a crystal grain which suffers from a significant change to its orientation, thereby helping to increase the electromechanical coupling factor of the resonance device and the Q value of the resonance device.

In some embodiments, a portion of the electrode layer 803 overlapping with the electrode layer 807 is disposed within the cavity 802a, and a portion of the electrode layer 807 overlapping with the electrode layer 803 is disposed above the cavity 802a.

In some embodiments, the material of the electrode layer 803 includes, but is not limited to, at least one of molybdenum, ruthenium, tungsten, platinum, iridium and aluminum, and the material of the electrode layer 807 includes, but is not limited to, at least one of molybdenum, ruthenium, tungsten, platinum, iridium and aluminum.

In some embodiments, the electrode layer 803 includes a negative electrode and the electrode layer 807 includes a positive electrode. In some embodiments, the electrode layer 803 includes a positive electrode and the electrode layer 807 includes a negative electrode.

Figure 8B:
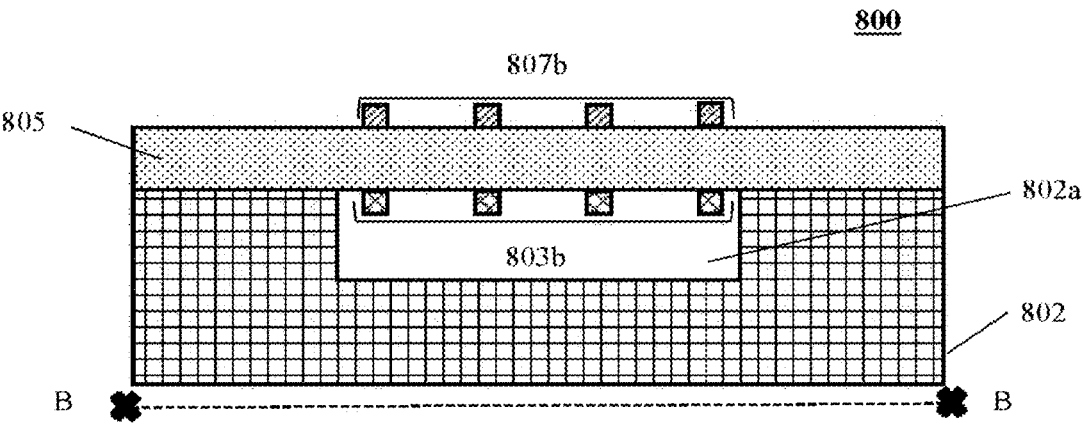
FIG. 8b illustrates a schematic structural view of a cross-section B of a bulk acoustic wave resonance device 800 according to an embodiment of the present disclosure.

FIG. 8b is a schematic structural view of a cross-section B of a bulk acoustic wave resonance device 800 according to an embodiment of the present disclosure.

As shown in FIG. 8b, the support layer 802 includes the cavity 802a embedded at the upper surface of the support layer 802. The electrode layer 803 includes four electrode bars 803b and the electrode layer 803 is disposed within the cavity 802a in the cross-section B. The piezoelectric layer 805 is disposed on the support layer 802 and the electrode layer 803. The electrode layer 807 includes four electrode bars 807b, and the electrode layer 807 is disposed on the piezoelectric layer 805. As can be seen in FIG. 8b, the resonance region (not shown, that is, the overlap region of the electrode layer 803 and the electrode layer 807) is suspended relative to the cavity 802a, and neither overlaps with nor is in contact with the support layer 802, and the perpendicular projection of the resonance region (not shown) perpendicular to the upper surface falls within the cavity 802a.

In some embodiments, the four electrode bars 803b include a negative electrode, and the four electrode bars 807b include a positive electrode. In some embodiments, the four electrode bars 803b include a positive electrode, and the four electrode bars 807b include a negative electrode.

In some embodiments, an interval between two adjacent electrode bars 803b is constant, which includes a first interval.

In some embodiments, correspondingly, an interval between two adjacent electrode bars 807b is constant, which includes a second interval, and the first interval is equal or close to the second interval.

In some embodiments, a width of the four electrode bars 803b is constant, which includes a first width.

In some embodiments, correspondingly, a width of the four electrode bars 807b is constant, which includes a second width, and the first width is equal or close to the second width.

In some embodiments, the duty factor of the four electrode bars 803b includes a first duty factor corresponding to the first interval and the first width, and the first duty factor includes, but is not limited to 0.1 to 1.

In some embodiments, correspondingly, the duty factor of the four electrode bars 807b includes the first duty factor.

It should be noted that when forming the electrode layers 803 and 807, the working frequency of the resonance device can be changed by modifying the first interval or the first width.

In some embodiments, the number of electrode bars included in the electrode layers 803 and 807 may be other even number, for example, 2, 6, 8, 10, 12, 14, 16, 18 and 20. In some embodiments, the number of electrode bars included in the electrode layers 803 and 807 may be an odd number, for example, 3, 5, 7, 9, 11, 13, 15, 17 and 19.

Figure 9A:
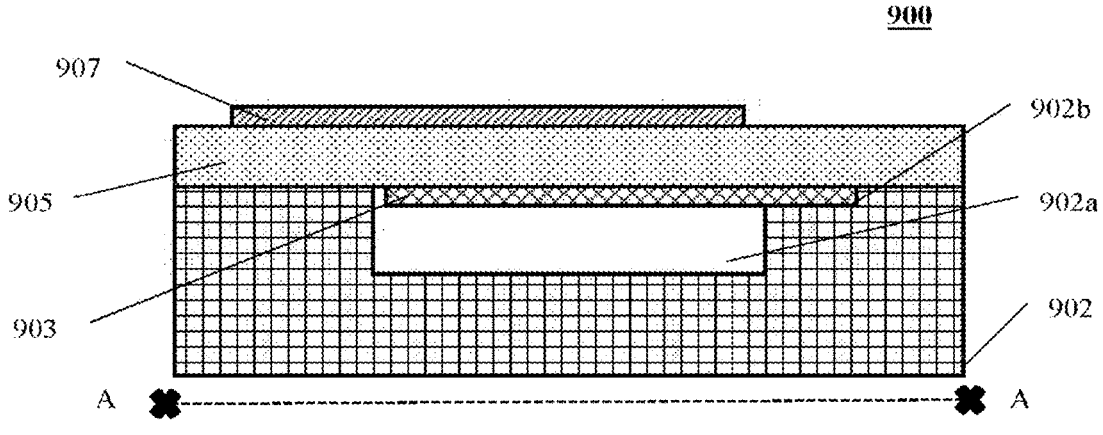
FIG. 9a illustrates a schematic structural view of a cross-section A of a bulk acoustic wave resonance device 900 according to an embodiment of the present disclosure.

FIG. 9a is a schematic structural view of a cross-section A of a bulk acoustic wave resonance device 900 according to an embodiment of the present disclosure.

As shown in FIG. 9a, embodiments of the present disclosure provide a bulk acoustic wave resonance device 900. The bulk acoustic wave resonance device 900 includes a support layer 902, an electrode layer 903, a piezoelectric layer 905 and an electrode layer 907. The support layer 902 includes a cavity 902a and a groove 902b embedded at an upper surface of the support layer 902 in the cross-section A. The groove 902b is disposed adjacent to the cavity 902a in a horizontal direction and communicated with the cavity 902a, and a depth of the groove 902b is less than a depth of the cavity 902a. A first end of the electrode layer 903 in the cross-section A is disposed within the groove 902b, a second end of the electrode layer 903 in the cross-section A is disposed within the cavity 902a, and the depth of the groove 902b is equal to a thickness of the electrode layer 903. The piezoelectric layer 905 is disposed on the support layer 902 and the electrode layer 903. The piezoelectric layer 905 is a flat layer and covers the cavity 902a. The electrode layer 907 is disposed on the piezoelectric layer 905. As can be seen in FIG. 9a, a resonance region (not shown, i.e., an overlap region of the electrode layer 903 and the electrode layer 907) is suspended relative to the cavity 902a, and neither overlaps with nor is in contact with the support layer 902, and a perpendicular projection of the resonance region (not shown) perpendicular to the upper surface falls within cavity 902a.

Embodiments of the present disclosure may increase the difference between the acoustic impedance of the resonance region (not shown) and the acoustic impedance of the non-resonance region, thereby increasing the Q value of the resonance device. In addition, the resonance device 900 according to the present disclosure does not include a substrate, thereby eliminating electrical losses caused by the substrate.

In some embodiments, the material of the support layer 902 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the support layer 902 includes, but is not limited to 20 micrometers to 100 micrometers.

In some embodiments, the piezoelectric layer 905 covers the upper surface of the support layer 902. In some embodiments, the material of the piezoelectric layer 905 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 905 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis.

The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 905 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 905 on a plane may allow the piezoelectric layer 905 not to include a crystal grain which suffers from a significant change to its orientation, thereby helping to increase the electromechanical coupling factor of the resonance device and the Q value of the resonance device.

In some embodiments, a portion of the electrode layer 903 overlapping with the electrode layer 907 is disposed within the cavity 902a, and a portion of the electrode layer 907 overlapping with the electrode layer 903 is disposed above the cavity 902a.

In some embodiments, the material of the electrode layer 903 includes, but is not limited to, at least one of molybdenum, ruthenium, tungsten, platinum, iridium and aluminum, and the material of the electrode layer 907 includes, but is not limited to, at least one of molybdenum, ruthenium, tungsten, platinum, iridium and aluminum.

In some embodiments, the electrode layer 903 includes a negative electrode and the electrode layer 907 includes a positive electrode. In some embodiments, the electrode layer 903 includes a positive electrode and the electrode layer 907 includes a negative electrode.

Figure 9B:
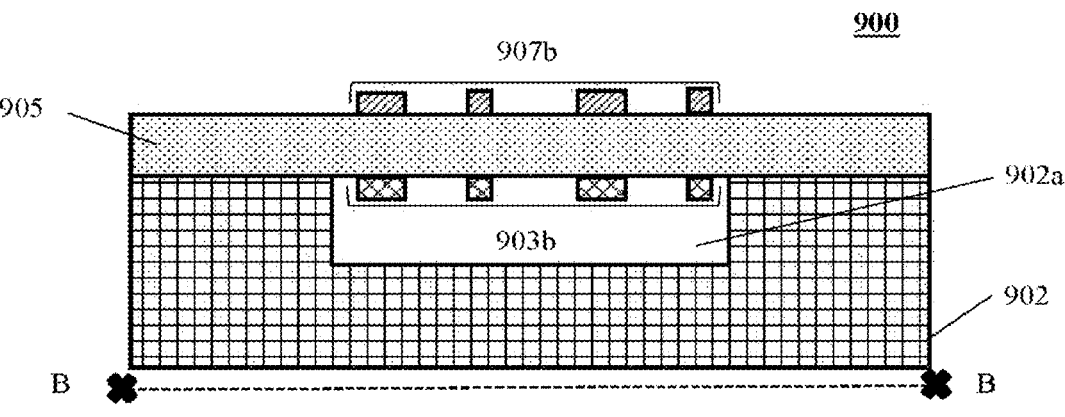
FIG. 9b illustrates a schematic structural view of a cross-section B of a bulk acoustic wave resonance device 900 according to an embodiment of the present disclosure.

FIG. 9b is a schematic structural view of a cross-section B of a bulk acoustic wave resonance device 900 according to an embodiment of the present disclosure.

As shown in FIG. 9b, the support layer 902 includes the cavity 902a embedded at the upper surface of the support layer 902 in the cross-section B. The electrode layer 903 includes four electrode bars 903b, and the electrode layer 903 is disposed within the cavity 902a in the cross-section B. The piezoelectric layer 905 is disposed on the support layer 902 and the electrode layer 903. The electrode layer 907 includes four electrode bars 907b, and the electrode layer 907 is disposed on the piezoelectric layer 905. As can be seen in FIG. 9b, the resonance region (not shown, that is, the overlap region of the electrode layer 903 and the electrode layer 907) is suspended relative to the cavity 902a and neither overlaps with nor is in contact support layer 902, and the perpendicular projection of the resonance region (not shown) perpendicular to the upper surface falls within the cavity 902a.

In some embodiments, the four electrode bars 903b include a negative electrode, and the four electrode bars 907b include a positive electrode. In some embodiments, the four electrode bars 903b include a positive electrode, and the four electrode bars 907b include a negative electrode.

In some embodiments, an interval between two adjacent electrode bars 903b is variable, which includes a first interval and a second interval, and the first interval is less than the second interval.

In some embodiments, correspondingly, an interval between two adjacent electrode bars 907b is variable, which includes a third interval and a fourth interval, and the third interval is less than the fourth interval, the first interval is equal or close to the third interval, and the second interval is equal or close to the fourth interval.

In some embodiments, a width of the four electrode bars 903b is variable, which includes a first width and a second width, and the first width is greater than the second width.

In some embodiments, correspondingly, a width of the four electrode bars 907b is variable, which includes a third width and a fourth width, and the third width is greater than the fourth width, the first width is equal or close to the third width, and the second width is equal or close to the fourth width.

In some embodiments, the duty factor of the four electrode bars 903b includes a first duty factor corresponding to the first width and the first interval, a second duty factor corresponding to the second width and the first interval, a third duty factor corresponding to the second width and the second interval, and a fourth duty cycle corresponding to the first width and the second interval. The first duty factor, the second duty factor, the third duty factor and the fourth duty factor include, but is not limited to 0.1 to 1.

In some embodiments, the duty factor of the four electrode bars 907b includes the first duty factor, the second duty factor, the third duty factor and the fourth duty cycle.

It should be noted that when forming the electrode layers 903 and 907, the working frequency of the resonance device can be changed by modifying the first interval, or the second interval, or the first width, or the second width.

In some embodiments, the number of electrode bars included in the electrode layers 903 and 907 may be other even number, for example, 2, 6, 8, 10, 12, 14, 16, 18 and 20. In some embodiments, the number of electrode bars included in the electrode layers 903 and 907 may be an odd number, for example, 3, 5, 7, 9, 11, 13, 15, 17 and 19.

Figure 10A:
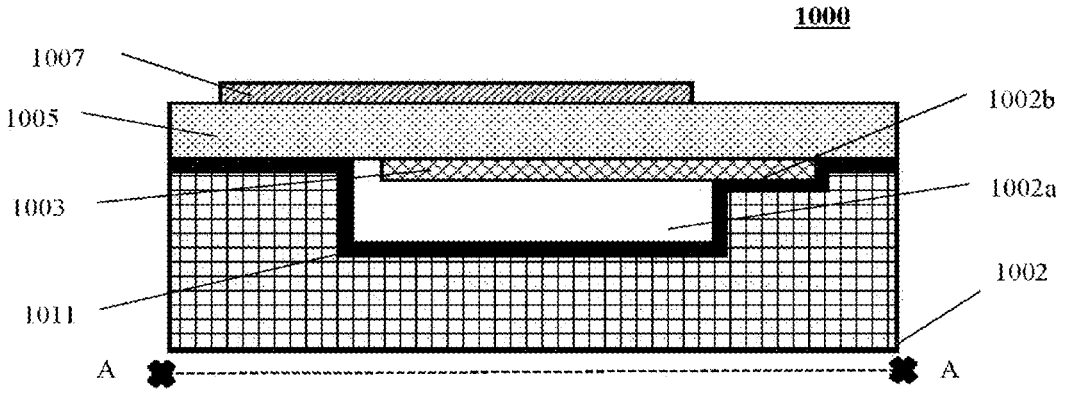
FIG. 10a illustrates a schematic structural view of a cross-section A of a bulk acoustic wave resonance device 1000 according to an embodiment of the present disclosure.

FIG. 10a is a schematic structural view of a cross-section A of a bulk acoustic wave resonance device 1000 according to an embodiment of the present disclosure.

As shown in FIG. 10a, embodiments of the present disclosure provide a bulk acoustic wave resonance device 1000. The bulk acoustic wave resonance device 1000 includes a support layer 1002, an etch shield layer 1011, an electrode layer 1003, a piezoelectric layer 1005 and an electrode layer 1007. The support layer 1002 includes a cavity 1002a and a groove 1002b embedded at an upper surface of the support layer 1002 in the cross-section A. The groove 1002b is disposed adjacent to the cavity 1002a in a horizontal direction and communicated with the cavity 1002a, and a depth of the groove 1002b is less than a depth of the cavity 1002a. The etch shield layer 1011 covers a bottom and a side wall of the cavity 1002a, a bottom and a side wall of the groove 1002b and the upper surface of the support layer 1002 in the cross-section A. A first end of the electrode layer 1003 in the cross-section A is disposed within the groove 1002b, a second end of the electrode layer 1003 in the cross-section A is disposed within the cavity 1002a, and the depth of the groove 1002b is equal to the sum of a thickness of the etch shield layer 1011 and a thickness of the electrode layer 1003. The piezoelectric layer 1005 is disposed on the etch shield layer 1011 and the electrode layer 1003. The piezoelectric layer 1005 is a flat layer and covers the cavity 1002a. The electrode layer 1007 is disposed on the piezoelectric layer 1005. As can be seen in FIG. 10a, a resonance region (not shown, i.e., an overlap region of the electrode layer 1003 and the electrode layer 1007) is suspended relative to the cavity 1002a, and neither overlaps with nor is in contact with the support layer 1002 and the etch shield layer 1011, and a perpendicular projection of the resonance region (not shown) perpendicular to the upper surface falls within the cavity 1002a.

Embodiments of the present disclosure may increase the difference between the acoustic impedance of the resonance region (not shown) and the acoustic impedance of the non-resonance region, thereby increasing the Q value of the resonance device. In addition, the resonance device 1000 according to the present disclosure does not include a substrate, thereby eliminating electrical losses caused by the substrate.

In some embodiments, the material of the support layer 1002 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the support layer 1002 includes, but is not limited to 20 micrometers to 100 micrometers.

In some embodiments, the material of the etch shield layer 1011 includes, but is not limited to, at least one of aluminum nitride, silicon carbide, diamond, silicon nitride, silicon dioxide, aluminum oxide, and titanium dioxide.

In some embodiments, the thickness of the etch shield layer 1011 includes, but is not limited to 2 micrometers to 6 micrometers.

It should be noted that the etch shield layer 1011 may serve to protect the support layer 1002 when forming the cavity 1002a by etch. In addition, the etch shield layer 1011 may protect the resonance device from being corroded by water or oxygen.

In some embodiments, the piezoelectric layer 1005 covers the etch shield layer 1011. In some embodiments, the material of the piezoelectric layer 1005 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1005 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1005 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 1005 on a plane may allow the piezoelectric layer 1005 not to include a crystal grain which suffers from a significant change to its orientation, thereby helping to increase the electromechanical coupling factor of the resonance device and the Q value of the resonance device.

In some embodiments, a portion of the electrode layer 1003 overlapping with the electrode layer 1007 is disposed within the cavity 1002a, and a portion of the electrode layer 1007 overlapping with the electrode layer 1003 is disposed above the cavity 1002a.

In some embodiments, the material of the electrode layer 1003 includes, but is not limited to, at least one of molybdenum, ruthenium, tungsten, platinum, iridium and aluminum, and the material of the electrode layer 1007 includes, but is not limited to, at least one of molybdenum, ruthenium, tungsten, platinum, iridium and aluminum.

In some embodiments, the electrode layer 1003 includes a positive electrode and a negative electrode and the electrode layer 1007 includes a positive electrode and a negative electrode.

Figure 10B:
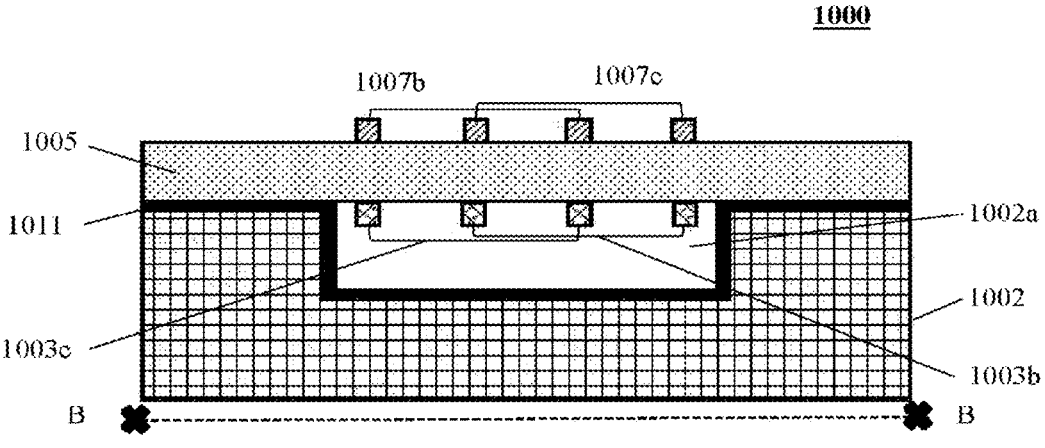
FIG. 10b illustrates a schematic structural view of a cross-section B of a bulk acoustic wave resonance device 1000 according to an embodiment of the present disclosure.

FIG. 10b is a schematic structural view of a cross-section B of a bulk acoustic wave resonance device 1000 according to an embodiment of the present disclosure.

As shown in FIG. 10b, the support layer 1002 includes the cavity 1002a embedded at the upper surface of the support layer 1002 in the cross-section B. The etch shield layer 1011 covers the bottom and the side wall of the cavity 1002a and the upper surface of the support layer 1002 in the cross-section B. The electrode layer 1003 includes two electrode bars 1003b and two electrode bars 1003c, and the electrode layer 1003 is disposed within the cavity 1002a in the cross-section B. The piezoelectric layer 1005 is disposed on the etch shield layer 1011 and the electrode layer 1003. The electrode layer 1007 includes two electrode bars 1007b and two electrode bars 1007c, and the electrode layer 1007 is disposed on the piezoelectric layer 1005. As can be seen in FIG. 10b, the resonance region (not shown, that is, the overlap region of the electrode layer 1003 and the electrode layer 1007) is suspended relative to the cavity 1002a, and neither overlaps with nor is in contact with the support layer 1002, and the perpendicular projection of the resonance region (not shown) perpendicular to the upper surface falls within the cavity 1002a.

In some embodiments, the two electrode bars 1003b include a negative electrode and the two electrode bars 1003c include a positive electrode, and the two electrode bars 1007b include a negative electrode and the two electrode bars 1007c include a positive electrodes electrode. In some embodiments, the two electrode bars 1003b include a positive electrode and the electrode bars 1003c include a negative electrode, and the two electrode bars 1007b include a positive electrode and the two electrode bars 1007c include a negative electrode.

In some embodiments, an interval between an electrode bar 1003b and an electrode bar 1003c adjacent to each other is constant, which includes a first interval.

In some embodiments, correspondingly, an interval between an electrode bar 1007b and an electrode bar 1007c adjacent to each other is constant, which includes a second interval, and the first interval is equal or close to the second interval.

In some embodiments, a width of the two electrode bars 1003b and a width of the two electrode bars 1003c are constant, which include a first width.

In some embodiments, correspondingly, a width of the two electrode bars 1007b and a width of the two electrode bars 1007c are constant, which include a second width, and the first width is equal or close to the second width.

In some embodiments, the duty factor of the two electrode bars 1003b and the two electrode bars 1003c includes a first duty factor corresponding to the first interval and the first width, and the first duty factor includes, but not limited to 0.1 to 1.

In some embodiments, correspondingly, the duty factor of the two electrode bars 1007b and the two electrode bars 1007c include the first duty factor.

It should be noted that, when forming the electrode layers 1003 and 1007, the working frequency of the resonance device can be changed by modifying the first interval or the first width.

In some embodiments, the number of electrode bars included in each of the electrode layers 1003 and 1007 may be other even number, for example, 2, 6, 8, 10, 12, 14, 16, 18, 20, and the like. In some embodiments, the number of electrode bars included in each of the electrode layers 1003 and 1007 may be an odd number, for example, 3, 5, 7, 9, 11, 13, 15, 17, 19, and the like.

Figure 11A:
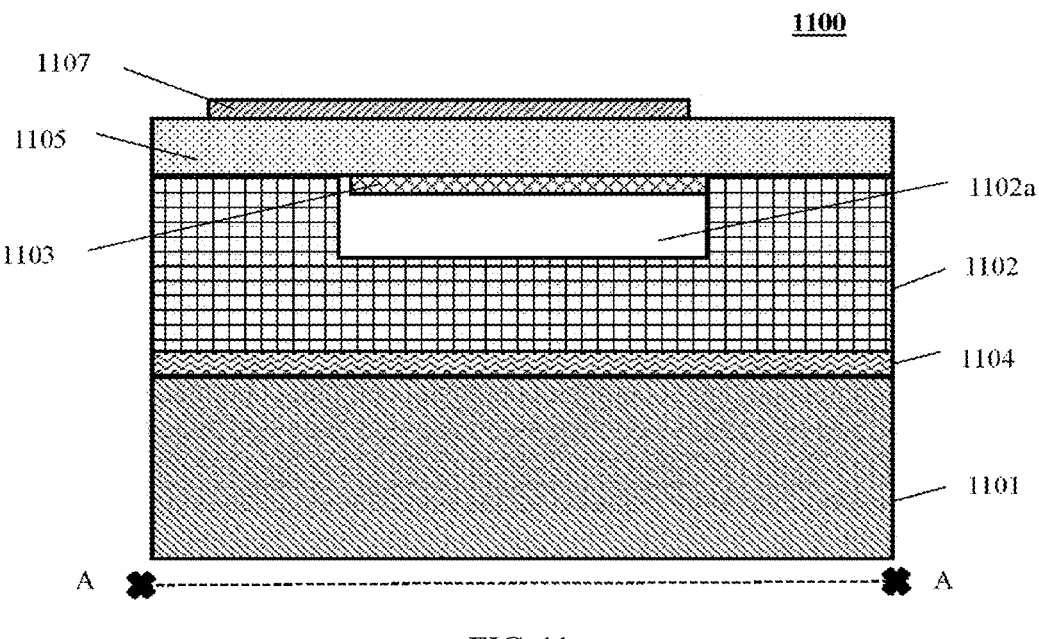
FIG. 11a illustrates a schematic structural view of a cross-section A of a bulk acoustic wave resonance device 1100 according to an embodiment of the present disclosure.

FIG. 11a is a schematic structural view of a cross-section A of a bulk acoustic wave resonance device 1100 according to an embodiment of the present disclosure.

As shown in FIG. 11a, embodiments of the present disclosure provide a bulk acoustic wave resonance device 1100. The bulk acoustic wave resonance device 1100 includes a substrate 1101, a film 1104, an intermediate layer 1102, an electrode layer 1103, a piezoelectric layer 1105 and an electrode layer 1107. The film 1104 is disposed on the substrate 1101. The intermediate layer 1102 is disposed on the film 1104, and includes a cavity 1102a embedded at an upper surface of the intermediate layer 1102. A first end of the electrode layer 1103 in the cross-section A is in contact with a side wall of the cavity 1102a, and a second end of the electrode layer 1103 in the cross-section A is disposed within the cavity 1102a. The piezoelectric layer 1105 is disposed on the intermediate layer 1102 and the electrode layer 1103. The piezoelectric layer 1105 is a flat layer and covers the cavity 1102a. The electrode layer 1107 is disposed on the piezoelectric layer 1105. As can be seen in FIG. 11a, a resonance region (not shown, i.e., an overlap region of the electrode layer 1103 and the electrode layer 1107) is suspended relative to the cavity 1102a, and neither overlaps with nor is in contact with the intermediate layer 1102, and a perpendicular projection of the resonance region (not shown) perpendicular to the upper surface falls within the cavity 1102a.

Embodiments of the present disclosure may increase the difference between the acoustic impedance of the resonance region (not shown) and the acoustic impedance of the non-resonance region, thereby improving the Q value of the resonance device. In addition, the acoustic impedance of the intermediate layer 1102 may be relatively smaller than that of the piezoelectric layer 1105, thereby preventing waves propagating from the resonance region (not shown) to the substrate 1101. In addition, the film 1104 (for example, a trap rich layer) helps to prevent formation of a free electron layer on a surface of the substrate 1101 to reduce the electrical loss caused by the substrate 1101.

In some embodiments, the material of the substrate 1101 includes, but is not limited to, at least one of silicon, silicon carbide and glass.

In some embodiments, the film 1104 includes, but is not limited to, a polycrystalline film. In some embodiments, the material of the polycrystalline film includes, but is not limited to, at least one of polysilicon, polycrystalline silicon nitride, and polycrystalline silicon carbide.

In some embodiments, the material of the intermediate layer 1102 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 1102 includes, but is not limited to 0.1 micrometer to 10 micrometers.

In some embodiments, the piezoelectric layer 1105 covers the upper surface of the intermediate layer 1102. In some embodiments, the material of the piezoelectric layer 1105 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1105 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system ($a \neq b \neq c$), (ii) tetragonal system ($a = b \neq c$), (iii) cubic system ($a = b = c$), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1105 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 1105 on a plane may allow the piezoelectric layer 1105 not to include a crystal grain which suffers from a significant change to its orientation, thereby helping to increase the electromechanical coupling factor of the resonance device and the Q value of the resonance device.

In some embodiments, a portion of the electrode layer 1103 overlapping with the electrode layer 1107 is disposed within the cavity 1102a, and a portion of the electrode layer 1107 overlapping with the electrode layer 1103 is disposed above the cavity 1102a.

In some embodiments, the material of the electrode layer 1103 includes, but is not limited to, at least one of molybdenum, ruthenium, tungsten, platinum, iridium and aluminum, and the material of the electrode layer 1107 includes, but is not limited to, at least one of molybdenum, ruthenium, tungsten, platinum, iridium and aluminum.

In some embodiments, the electrode layer 1103 includes a positive electrode and a negative electrode, and the electrode layer 1107 includes a positive electrode and a negative electrode.

Figure 11B:
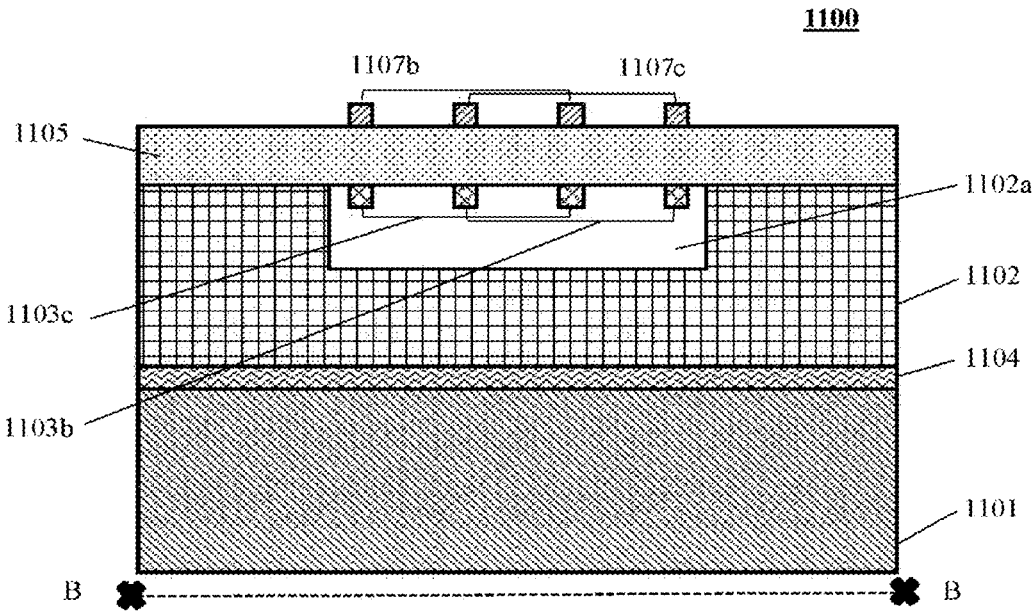
FIG. 11b illustrates a schematic structural view of a cross-section B of a bulk acoustic wave resonance device 1100 according to an embodiment of the present disclosure.

FIG. 11b is a schematic structural view of a cross-section B of a bulk acoustic wave resonance device 1100 according to an embodiment of the present disclosure.

As shown in FIG. 11b, the film 1104 is disposed on the substrate 1101, and the intermediate layer 1102 is disposed on the film 1104. The intermediate layer 1102 includes the cavity 1102a embedded at the upper surface of the intermediate layer 1102. The electrode layer 1103 includes two electrode bars 1103b and two electrode bars 1103c, and the electrode layer 1103 is disposed in the cavity 1102a in the cross-section B. The piezoelectric layer 1105 is disposed on the intermediate layer 1102 and the electrode layer 1103. The electrode layer 1107 includes two electrode bars 1107b and two electrode bars 1107c, and the electrode layer 1107 is disposed on the piezoelectric layer 1105. As can be seen in FIG. 11b, the resonance region (not shown, that is, the overlap region of the electrode layer 1103 and the electrode layer 1107) is suspended relative to the cavity 1102a, and neither overlaps with nor is in contact with the intermediate layer 1102, and the perpendicular projection of the resonance region (not shown) perpendicular to the upper surface falls within the cavity 1102a.

In some embodiments, the two electrode bars 1103b include a negative electrode and the two electrode bars 1103c include a positive electrode, and the two electrode bars 1107b include a negative electrode and the two electrode bars 1107c include a positive electrode. In some embodiments, the two electrode bars 1103b include a positive electrode and the two electrode bars 1103c include a negative electrode, and the two electrode bars 1107b include a positive electrode and the two electrode bars 1107c include a negative electrode.

In some embodiments, an interval between an electrode bar 1103b and an electrode bar 1103c adjacent to each other is constant, which includes a first interval.

In some embodiments, correspondingly, an interval between an electrode bar 1107b and an electrode bar 1107c adjacent to each other is constant, which includes a second interval, and the first interval is equal or close to the second interval.

In some embodiments, a width of the two electrode bars 1103b and a width of the two electrode bars 1103c are constant, which include a first width.

In some embodiments, correspondingly, a width of the two electrode bars 1107b and a width of the two electrode bars 1107c are constant, which include a second width, and the first width is equal or close to the second width.

In some embodiments, the duty factor of the two electrode bars 1103b and the two electrode bars 1103c includes a first duty factor corresponding to the first interval and the first width, and the first duty factor includes, but is not limited to 0.1 to 1.

In some embodiments, correspondingly, the duty factor of the two electrode bars 1107b and the two electrode bars 1107c include the first duty factor.

In some embodiments, when forming the electrode layers 1103 and 1107, the working frequency of the resonance device can be changed by modifying the first interval or the first width.

In some embodiments, the number of electrode bars included in each of the electrode layers 1103 and 1107 may be other even number, for example, 2, 6, 8, 10, 12, 14, 16, 18, 20, and the like. In some embodiments, the number of electrode bars included in each of the electrode layers 1103 and 1107 may be an odd number, for example, 3, 5, 7, 9, 11, 13, 15, 17, 19, and the like.

Figure 12A:
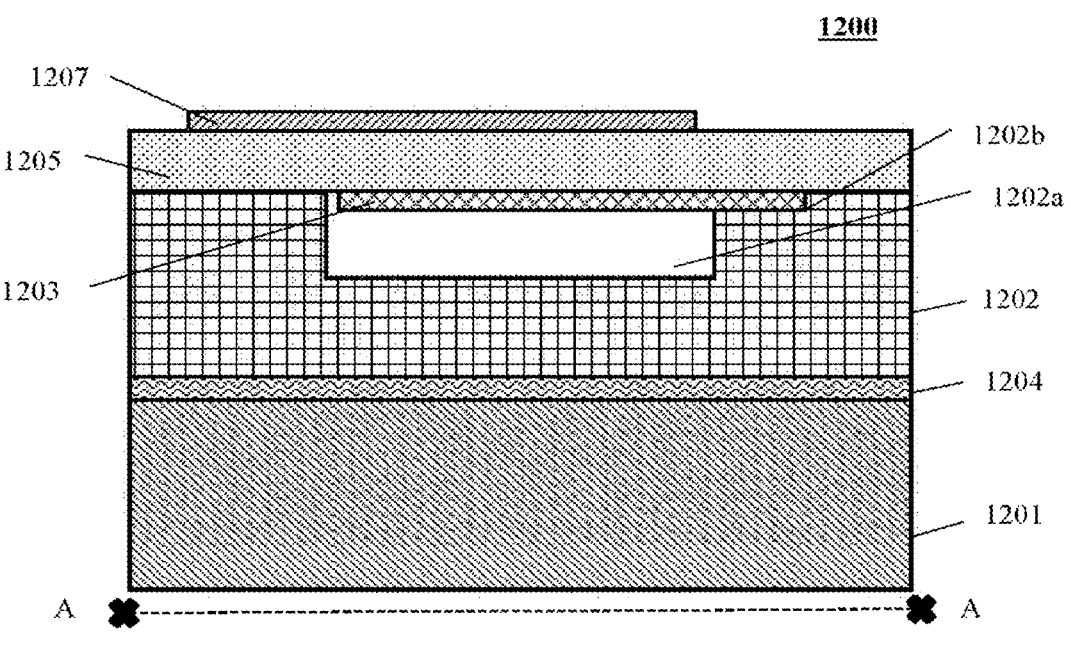
FIG. 12a illustrates a schematic structural view of a cross-section A of a bulk acoustic wave resonance device 1200 according to an embodiment of the present disclosure.

FIG. 12a is a schematic structural view of a cross-section A of a bulk acoustic wave resonance device 1200 according to an embodiment of the present disclosure.

As shown in FIG. 12a, embodiments of the present disclosure provide a bulk acoustic wave resonance device 1200. The bulk acoustic wave resonance device 1200 includes a substrate 1201, a film 1204, an intermediate layer 1202, an electrode layer 1203, a piezoelectric layer 1205 and an electrode layer 1207. The film 1204 is disposed on the substrate 1201. The intermediate layer 1202 is disposed on the film 1204, and includes a cavity 1202a and a groove 1202b embedded at an upper surface of the intermediate layer 1202 in the cross-section A. The groove 1202b is disposed adjacent to the cavity 1202a in a horizontal direction and communicated with the cavity 1202a, and a depth of the groove 1202b is less than a depth of the cavity 1202a. A first end of the electrode layer 1203 in the cross-section A is located within the groove 1202b, a second end of the electrode layer 1203 in the cross-section A is located within the cavity 1202a, and the depth of the groove 1202b is equal to a thickness of the electrode layer 1203. The piezoelectric layer 1205 is disposed on the intermediate layer 1202 and the electrode layer 1203. The piezoelectric layer 1205 is a flat layer and covers the cavity 1202a. The electrode layer 1207 is disposed on the piezoelectric layer 1205. As can be seen in FIG. 12a, a resonance region (not shown, i.e., an overlap region of the electrode layer 1203 and the electrode layer 1207) is suspended relative to the cavity 1202a, and neither overlaps with nor is in contact with the intermediate layer 1202, and a perpendicular projection of the resonance region (not shown) perpendicular to the upper surface falls within the cavity 1202a.

Embodiments of the present disclosure may increase the difference between the acoustic impedance of the resonance region (not shown) and the acoustic impedance of the non-resonance region, thereby increasing the Q value of the resonance device. In addition, the acoustic impedance of the intermediate layer 1202 may be relatively smaller than that of the piezoelectric layer 1205, thereby preventing waves propagating from the resonance region (not shown) to the substrate 1201. In addition, the film 1204 helps to prevent formation of a free electron layer on a surface of the substrate 1201 to reduce the electrical loss caused by the substrate 1201.

In some embodiments, the material of the substrate 1201 includes, but is not limited to, at least one of silicon, silicon carbide, and glass.

In some embodiments, the film 1204 includes, but is not limited to, a polycrystalline film. In some embodiments, the material of the polycrystalline film includes, but is not limited to, at least one of polysilicon, polycrystalline silicon nitride, and polycrystalline silicon carbide.

In some embodiments, the material of the intermediate layer 1202 includes, but is not limited to, at least one of polymer and insulating dielectric. In some embodiments, the polymer includes, but is not limited to, at least one of benzocyclobutene (i.e., BCB), photosensitive epoxy resin photoresist (e.g., SU-8), and polyimide. In some embodiments, the insulating dielectric includes, but is not limited to, at least one of aluminum nitride, silicon dioxide, silicon nitride, and titanium oxide.

In some embodiments, the thickness of the intermediate layer 1202 includes, but is not limited to 0.1 micrometer to 10 micrometers.

In some embodiments, the piezoelectric layer 1205 covers the upper surface of the intermediate layer 1202. In some embodiments, the material of the piezoelectric layer 1205 includes, but is not limited to, at least one of aluminum nitride, aluminum nitride alloy, gallium nitride, zinc oxide, lithium tantalate, lithium niobate, lead zirconate titanate, and lead magnesium niobate-lead titanate.

In some embodiments, the piezoelectric layer 1205 includes crystal grains. Crystal grains include a first crystal grain and a second crystal grain, and the first crystal grain and the second crystal grain are any two crystal grains of crystal grains. In some embodiments, the art that crystal orientation and crystal plane of a crystal grain can be represented based on a coordinate system. As shown in FIG. 13, a hexagonal crystal grain, such as an aluminum nitride crystal grain, may be represented by an ac stereoscopic coordinate system (including a-axis and c-axis). As shown in FIG. 14, the crystal grains of (i) orthorhombic system (a≠b≠c), (ii) tetragonal system (a=b≠c), (iii) cubic system (a=b=c), etc., may be represented by an xyz stereoscopic coordinate system (including x-axis, y-axis and z-axis). In addition to the two embodiments described above, crystal grains may also be represented based on other coordinate systems, and therefore the present disclosure is not limited by the two embodiments described above.

In some embodiments, the first crystal grain may be represented based on a first stereoscopic coordinate system, and the second crystal grain may be represented based on a second stereoscopic coordinate system. The first stereoscopic coordinate system includes at least a first coordinate axis along a first direction and a third coordinate axis along a third direction, and the second stereoscopic coordinate system includes at least a second coordinate axis along a second direction and a fourth coordinate axis along a fourth direction. The first coordinate axis corresponds to a height of the first crystal grain, and the second coordinate axis corresponds to a height of the second crystal grain.

In some embodiments, the first direction is the same as or opposite to the second direction. It should be noted that the first direction being the same as the second direction means that an included angle between a vector along the first direction and a vector along the second direction ranges from 0 degree to 5 degrees, and the first direction being opposite to the second direction means that the included angle between the vector along the first direction and the vector along the second direction ranges from 175 degrees to 180 degrees.

In some embodiments, the first stereoscopic coordinate system is an ac stereoscopic coordinate system, and the first coordinate axis is a first c-axis and the third coordinate axis is a first a-axis. The second stereoscopic coordinate system is an ac stereoscopic coordinate system, and the second coordinate axis is a second c-axis, and the fourth coordinate axis is a second a-axis. The first c-axis and the second c-axis have the same or opposite orientation.

In some embodiments, the first stereoscopic coordinate system further includes a fifth coordinate axis along a fifth direction and the second stereoscopic coordinate system further includes a sixth coordinate axis along a sixth direction. In some embodiments, the first direction is the same as or opposite to the second direction, and the third direction is the same as or opposite to the fourth direction. It should be noted that the third direction being the same as the fourth direction means that an included angle between a vector along the third direction and a vector along the fourth direction ranges from 0 degree to 5 degrees, and the third direction being opposite to the fourth direction means that the included angle between the vector along the third direction and the vector along the fourth direction ranges from 175 degrees to 180 degrees.

In some embodiments, the first stereoscopic coordinate system is an xyz stereoscopic coordinate system, and the first coordinate axis is a first z-axis, the third coordinate axis is a first y-axis, and the fifth coordinate axis is a first x-axis. The second stereoscopic coordinate system is an xyz stereoscopic coordinate system, and the second coordinate axis is a second z-axis, the fourth coordinate axis is a second y-axis, and the sixth coordinate axis is a second x-axis. In some embodiments, the first z-axis and the second z-axis have the same orientation, and the first y-axis and the second y-axis have the same orientation. In some embodiments, the first z-axis and the second z-axis have opposite orientation, and the first y-axis and the second y-axis have opposite orientation. In some embodiments, the first z-axis and the second z-axis have the same orientation, and the first y-axis and the second y-axis have opposite orientation. In some embodiments, the first z-axis and the second z-axis have opposite orientation, and the first y-axis and the second y-axis have the same orientation.

In some embodiments, the piezoelectric layer 1205 includes crystal grains and a crystal composed of crystal grains has a full width at half maximum of rocking curve less than 2.5 degrees. It should be noted that the rocking curve describes a magnitude of angular divergence of a particular crystal plane (a crystal plane determined by a diffraction angle) in a sample, which is represented by a plane coordinate system, and an abscissa represents an angle between the crystal plane and a sample plane, and an ordinate represents a diffraction intensity of the crystal plane at a certain angle. The rocking curve is used to represent quality of the crystal, and the smaller the full width at half maximum is, the better the quality of the crystal is. In addition, the Full Width at Half Maximum (FWHM) refers to an interval between two points whose function values are equal to a half of a peak value of the function.

It should be noted that forming the piezoelectric layer 1205 on a plane may allow the piezoelectric layer 1205 not to include a crystal gain which suffers from a significant change to its orientation, thereby helping to increase the electromechanical coupling factor of the resonance device and the Q value of the resonance device.

In some embodiments, a portion of the electrode layer 1203 overlapping with the electrode layer 1207 is disposed within the cavity 1202a, and a portion of the electrode layer 1207 overlapping with the electrode layer 1203 is disposed above the cavity 1202a.

In some embodiments, the material of the electrode layer 1203 includes, but is not limited to, at least one of molybdenum, ruthenium, tungsten, platinum, iridium and aluminum, and the material of the electrode layer 1207 includes, but is not limited to, at least one of molybdenum, ruthenium, tungsten, platinum, iridium and aluminum.

In some embodiments, the electrode layer 1203 includes a positive electrode and a negative electrode, and the electrode layer 1207 includes a positive electrode and a negative electrode.

Figure 12B:
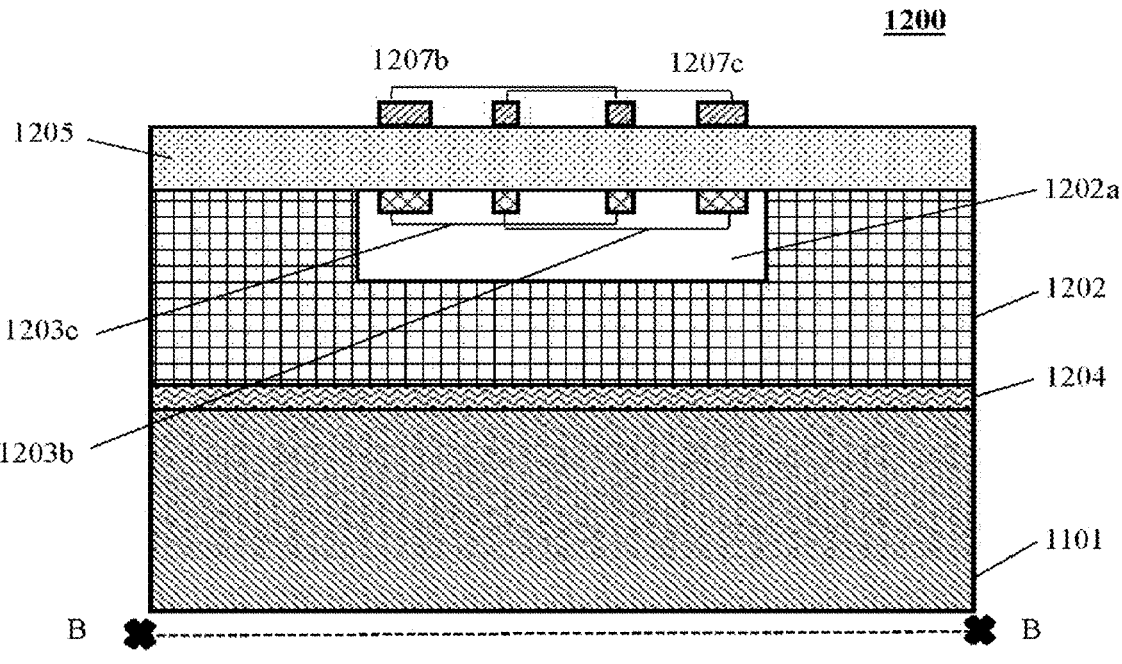
FIG. 12b illustrates a schematic structural view of a cross-section B of a bulk acoustic wave resonance device 1200 according to an embodiment of the present disclosure.

FIG. 12b is a schematic structural view of a cross-section B of a bulk acoustic wave resonance device 1200 according to an embodiment of the present disclosure.

As shown in FIG. 12b, the film 1204 is disposed on the substrate 1201, and the intermediate layer 1202 is disposed on the film 1204. The intermediate layer 1202 includes the cavity 1202a embedded at the upper surface of the intermediate layer 1202 in the cross-section B. The electrode layer 1203 includes two electrode bars 1203b and two electrode bars 1203c, and the electrode layer 1203 is disposed in the cavity 1202a in the cross-section B. The piezoelectric layer 1205 is disposed on the intermediate layer 1202 and the electrode layer 1203. The electrode layer 1207 includes two electrode bars 1207b and two electrode bars 1207c, and the electrode layer 1207 is disposed on the piezoelectric layer 1205. As can be seen in FIG. 12b, the resonance region (not shown, that is, the overlap region of the electrode layer 1203 and the electrode layer 1207) is suspended relative to the cavity 1202a, and neither overlaps with nor is in contact with the intermediate layer 1202, and the perpendicular projection of the resonance region (not shown) perpendicular to the upper surface falls within the cavity 1202a.

In some embodiments, the two electrode bars 1203b include a negative electrode and the two electrode bars 1203c include a positive electrode, and the two electrode bars 1207b include a negative electrode and the two electrode bars 1207c include a positive electrode. In some embodiments, the two electrode bars 1203b include a positive electrode and the two electrode bars 1203c include a negative electrode, and the two electrode bars 1207b include a positive electrode and the two electrode bars 1207c include a negative electrode.

In some embodiments, an interval between an electrode bar 1203b and an electrode bar 1203c adjacent to each other is variable, which includes a first interval and a second interval, and the first interval is less than the second interval.

In some embodiments, correspondingly, an interval between an electrode bar 1207b and an electrode bar 1207c adjacent to each other is variable, which includes a third interval and a fourth interval, and the third interval is less than the fourth interval, the first interval is equal or close to the third interval, and the second interval is equal or close to the fourth interval.

In some embodiments, a width of the two electrode bars 1203b and a width of the two electrode bars 1203c are variable, which include a first width and a second width, and the first width is greater than the second width.

In some embodiments, correspondingly, a width of the two electrode bars 1207b and a width of the two electrode bars 1207c are variable, which include a third width and a fourth width, and the third width is greater than the fourth width, the first width is equal or close to the third width, and the second width is equal or close to the fourth width.

In some embodiments, the duty factor of the two electrode bars 1203b and the two electrode bars 1203c includes a first duty factor corresponding to the first interval and the first width, a second duty factor corresponding to the first interval and the second width, and a third duty factor corresponding to the second interval and the second width, and the first duty factor, the second duty factor and the third duty factor include, but is not limited to 0.1 to 1.

In some embodiments, correspondingly, the duty factor of the two electrode bars 1207b and the two electrode bars 1207c includes the first duty factor, the second duty factor and the third duty factor.

It should be noted that when forming the electrode layers 1203 and 1207, the working frequency of the resonance device can be changed by modifying the first interval, or the second interval, or the first width, or the second width.

In some embodiments, the number of electrode bars included in each of the electrode layers 1203 and 1207 may be other even number, for example, 2, 6, 8, 10, 12, 14, 16, 18, and 20. In some embodiments, the number of electrode bars included in each of the electrode layers 1203 and 1207 may be an odd number, such as 3, 5, 7, 9, 11, 13, 15, 17 and 19.

Embodiments of the present disclosure also provide a bulk acoustic wave filter device. The bulk acoustic wave filter device includes, but is not limited to, at least one bulk acoustic wave resonance device according to any one of above embodiments.

In view of the above, the present disclosure can increase difference between an acoustic impedance of a resonance region and that of a non-resonance region by adjusting positions of two electrode layers and there is neither overlap nor contact between the resonance region and an intermediate layer or a support layer or a first substrate and the resonance region is suspended relative to a cavity of the intermediate layer or the support layer or the first substrate, thereby increasing a Q value of a resonance device. In addition, when forming the two electrode layers, a frequency of the resonance device can be changed by modifying a width of electrode bars or an interval between electrode bars. In addition, a piezoelectric layer is formed on a flat surface, which allows the piezoelectric layer not to include a crystal grain which suffers from a significant change to its orientation, thereby helping to increase the electromechanical coupling factor of the resonance device and the Q value of the resonance device. Further, the intermediate layer has a relatively smaller acoustic impedance than that of the piezoelectric layer, thus waves can be prevented from propagating from the resonance region to the second substrate. In addition, the film is disposed between the intermediate layer and the second substrate, which helps to prevent formation of a free electron layer on a surface of the second substrate, thereby reducing electrical loss caused by the second substrate.

The invention claimed is:

1. A bulk acoustic wave resonance device, comprising:
   a first layer comprising a cavity disposed at a first side of the first layer;
   a first electrode layer disposed in the cavity;
   a second layer disposed at the first side and disposed on the first electrode layer, wherein the second layer is a flat layer and covers the first cavity; and a second electrode layer disposed at the first side and disposed on the second layer, wherein the first electrode layer comprises at least two first electrode bars or the second electrode layer comprises at least two second electrode bars;

wherein the second layer comprises a piezoelectric layer comprising a plurality of crystal grains, the plurality of crystal grains comprising a first crystal grain and a second crystal grain, and the first crystal grain and the second crystal grain are any two crystal grains of the plurality of crystal grains, wherein a first coordinate axis along a first direction corresponds to a height of the first crystal grain, a second coordinate axis along a second direction corresponds to a height of the second crystal grain, and the first direction is the same as or opposite to the second direction;

wherein the first electrode layer and the second electrode layer are adapted to excite a bulk acoustic wave propagating in a direction perpendicular to the piezoelectric layer, and the bulk acoustic wave propagating in the direction perpendicular to the piezoelectric layer comprises a shear vertical wave or a longitudinal wave;

wherein an overlap portion of the second electrode layer overlapping with the first electrode layer is disposed above the cavity, and a projection of the overlap portion along a direction perpendicular to the first layer falls within the cavity so as to prevent the bulk acoustic wave propagating from a resonance region to the first layer.

2. The bulk acoustic wave resonance device according to claim 1, further comprising a second substrate disposed at a second side of the first layer, wherein the second side is opposite to the first side.

3. The bulk acoustic wave resonance device according to claim 2, further comprising a film disposed between the first layer and the second substrate.

4. The bulk acoustic wave resonance device according to claim 3, wherein the film comprises a polycrystalline film.

5. The bulk acoustic wave resonance device according to claim 4, wherein the polycrystalline film is made of one or more materials selected from a group consisting of polysilicon, polycrystalline silicon nitride, and polycrystalline silicon carbide.

6. The bulk acoustic wave resonance device according to claim 2, wherein the second substrate is made of one or more materials selected from a group consisting of silicon, silicon carbide and glass.

7. The bulk acoustic wave resonance device according to claim 1, wherein the first layer further comprises a support layer, and the support layer comprises the cavity.

8. The bulk acoustic wave resonance device according to claim 7, wherein the support layer is made of one or more materials selected from a group consisting of polymer and insulating dielectric.

9. The bulk acoustic wave resonance device according to claim 8, wherein the polymer comprises at least one selected from a group consisting of benzocyclobutene, photosensitive epoxy resin photoresist, and polyimide.

10. The bulk acoustic wave resonance device according to claim 8, wherein the insulating dielectric comprises at least one selected from a group consisting of aluminum nitride, silicon dioxide, silicon nitride, and titanium oxide.

11. The bulk acoustic wave resonance device according to claim 7, wherein the support layer has a thickness ranging from 20 micrometers to 100 micrometers.

12. The bulk acoustic wave resonance device according to claim 1, wherein the first layer further comprises an inter-mediate layer, and the intermediate layer comprises the cavity, wherein an acoustic impedance of the intermediate layer is smaller than an acoustic impedance of the piezo-electric layer.

13. The bulk acoustic wave resonance device according to claim 12, wherein the intermediate layer is made of one or more materials selected from a group consisting of polymer and insulating dielectric.

14. The bulk acoustic wave resonance device according to claim 13, wherein the intermediate layer is made of polymer comprising at least one selected from a group consisting of benzocyclobutene, photosensitive epoxy resin photoresist, and polyimide.

15. The bulk acoustic wave resonance device according to claim 13, wherein the intermediate layer is made of insulating dielectric comprising at least one selected from a group consisting of aluminum nitride, silicon dioxide, silicon nitride, and titanium oxide.

16. The bulk acoustic wave resonance device according to claim 12, wherein the intermediate layer has a thickness ranging from 0.1 micrometer to 10 micrometers.

17. The bulk acoustic wave resonance device according to claim 1, wherein the first layer further comprises an etch shield layer covering at least a bottom or a side wall of the cavity.

18. The bulk acoustic wave resonance device according to claim 17, wherein the etch shield layer is made of one or more materials selected from a group consisting of aluminum nitride, silicon carbide, diamond, silicon nitride, silicon dioxide, aluminum oxide and titanium dioxide.

19. The bulk acoustic wave resonance device according to claim 17, wherein the etch shield layer has a thickness ranging from 0.1 micrometer to 3 micrometers.

20. The bulk acoustic wave resonance device according to claim 17, wherein the etch shield layer has a thickness ranging from 2 micrometers to 6 micrometers.

21. The bulk acoustic wave resonance device according to claim 1, wherein the first crystal grain corresponds to a first coordinate system comprising the first coordinate axis and a third coordinate axis along a third direction, and the second crystal grain corresponds to a second coordinate system comprising the second coordinate axis and a fourth coordinate axis along a fourth direction.

22. The bulk acoustic wave resonance device according to claim 21, wherein the first coordinate system further comprises a fifth coordinate axis along a fifth direction and the second coordinate system further comprises a sixth coordinate axis along a sixth direction.

23. The bulk acoustic wave resonance device according to claim 22, wherein the third direction is the same as or opposite to the fourth direction.

24. A bulk acoustic wave filter device, comprising at least one bulk acoustic wave resonance device according to claim 1.

25. A radio frequency front end device, comprising a power amplification device and at least one bulk acoustic wave filter device according to claim 24, wherein the power amplification device is coupled with the bulk acoustic wave filter device.

26. A radio frequency front end device, comprising a low noise amplification device and at least one bulk acoustic wave filter device according to claim 24, wherein the low noise amplification device is coupled with the bulk acoustic wave filter device.

27. A radio frequency front end device, comprising a multiplexing device, wherein the multiplexing device comprises at least one bulk acoustic wave filter device according to claim 24.

28. The bulk acoustic wave resonance device according to claim 1, wherein the first electrode layer comprises a first polarity and the second electrode layer comprises a second polarity.

29. The bulk acoustic wave resonance device according to claim 28, wherein the at least two first electrode bars comprise the first polarity.

30. The bulk acoustic wave resonance device according to claim 28, wherein the at least two second electrode bars comprise the second polarity.

31. The bulk acoustic wave resonance device according to claim 1, wherein the first electrode layer comprises a first polarity and a second polarity, and the second electrode layer comprises the first polarity and the second polarity.

32. The bulk acoustic wave resonance device according to claim 31, wherein the at least two first electrode bars comprise the first polarity and the second polarity, the at least two second electrode bars comprise the first polarity and the second polarity, and a pair of a first electrode bar and a second electrode bar disposed correspondingly at both sides of the second layer comprise the first polarity and the second polarity respectively.

33. The bulk acoustic wave resonance device according to claim 31, wherein the first polarity and the second polarity are arranged alternatively.

34. The bulk acoustic wave resonance device according to claim 1, wherein the first layer further comprises a first substrate, and the first substrate comprises the cavity.

35. The bulk acoustic wave resonance device according to claim 34, wherein the first substrate is made of one or more materials selected from a group consisting of silicon, silicon carbide and glass.

36. The bulk acoustic wave resonance device according to claim 1, wherein the at least two first electrode bars comprise at least one first duty factor, and the at least one first duty factor has a value ranging from 0.1 to 1.

37. The bulk acoustic wave resonance device according to claim 1, wherein the at least two second electrode bars comprise at least one second duty factor, and the at least one second duty factor has a value ranging from 0.1 to 1.

38. The bulk acoustic wave resonance device according to claim 1, wherein two adjacent first electrode bars have a constant interval, and the interval comprises a first interval.

39. The bulk acoustic wave resonance device according to claim 1, wherein two adjacent second electrode bars have a constant interval, and the interval comprises a second interval.

40. The bulk acoustic wave resonance device according to claim 1, wherein two adjacent first electrode bars have a variable interval, and the interval comprises a third interval and a fourth interval.

41. The bulk acoustic wave resonance device according to claim 1, wherein two adjacent second electrode bars have a variable interval, and the interval comprises a fifth interval and a sixth interval.

42. The bulk acoustic wave resonance device according to claim 1, wherein the at least two first electrode bars have a constant width, and the width comprises a first width.

43. The bulk acoustic wave resonance device according to claim 1, wherein the at least two second electrode bars have a constant width, and the width comprises a second width.

44. The bulk acoustic wave resonance device according to claim 1, wherein the at least two first electrode bars have a variable width, and the width comprises a third width and a fourth width.

45. The bulk acoustic wave resonance device according to claim 1, wherein the at least two second electrode bars have a variable width, and the width comprises a fifth width and a sixth width.

46. The bulk acoustic wave resonance device according to claim 1, wherein the first electrode layer is made of one or more materials selected from a group consisting of molybdenum, ruthenium, tungsten, platinum, iridium and aluminum, and the second electrode layer is made of one or more materials selected from a group consisting of molybdenum, ruthenium, tungsten, platinum, iridium and aluminum.

47. The bulk acoustic wave resonance device according to claim 1, wherein the piezoelectric layer is made of one or more materials selected from a group consisting of aluminum nitride, aluminum nitride alloy, gallium nitride, zinc oxide, lithium tantalate, lithium niobate, lead zirconate titanate, and lead magnesium niobate-lead titanate.

48. The bulk acoustic wave resonance device according to claim 1, wherein a crystal composed of the plurality of crystal grains has a full width at half maximum of rocking curve less than 2.5 degrees.

49. The bulk acoustic wave resonance device according to claim 1, wherein the first electrode layer comprises a plate electrode and the second electrode layer comprises multiple electrode bars, and both the plate electrode and the multiple electrode bars are electrically charged.

50. The bulk acoustic wave resonance device according to claim 1, wherein the second electrode layer comprises a plate electrode and the first electrode layer comprises multiple electrode bars, and both the plate electrode and the multiple electrode bars are electrically charged.

* * * * *